(12) United States Patent
Yoshida et al.

(10) Patent No.: US 12,313,242 B2
(45) Date of Patent: *May 27, 2025

(54) LIGHT SOURCE DEVICE

(71) Applicant: NICHIA CORPORATION, Anan (JP)

(72) Inventors: Norimasa Yoshida, Komatsushima (JP); Tsuyoshi Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/452,687

(22) Filed: Aug. 21, 2023

(65) Prior Publication Data

US 2023/0400169 A1 Dec. 14, 2023

Related U.S. Application Data

(63) Continuation of application No. 17/731,991, filed on Apr. 28, 2022, now Pat. No. 11,802,678, which is a
(Continued)

(30) Foreign Application Priority Data

Oct. 30, 2019 (JP) ................................ 2019-197984
Jun. 29, 2020 (JP) ................................ 2020-112022

(51) Int. Cl.
*F21V 13/04* (2006.01)
*F21V 5/04* (2006.01)
*G02B 27/30* (2006.01)

(52) U.S. Cl.
CPC .............. *F21V 13/04* (2013.01); *F21V 5/045* (2013.01); *G02B 27/30* (2013.01); *F21V 2200/00* (2015.01)

(58) Field of Classification Search
CPC .......... F21V 5/045; F21V 5/048; F21V 5/008; F21V 13/04; F21V 2200/00; G02B 27/30;
(Continued)

(56) References Cited

U.S. PATENT DOCUMENTS 5,526,190 A    6/1996  Hubble et al.
6,402,347 B1   6/2002  Maas et al.
(Continued)

FOREIGN PATENT DOCUMENTS

CN    201407519 Y    2/2010
CN    102449378 A    5/2012
(Continued)

OTHER PUBLICATIONS

International Search Report with English translation and Written Opinion mailed Oct. 27, 2020 corresponding to International Application No. PCT/JP2020/034188.
(Continued)

*Primary Examiner* — Robert J May
(74) *Attorney, Agent, or Firm* — Foley & Lardner LLP

(57) ABSTRACT

A light source device includes: a light emitting device having an upper face including a light emission face; and a first lens having a lower face that faces the light emitting device, and an upper face opposite the lower face. The lower face of the first lens includes: an entrance part located in a center of the lower face where light from the light emitting device enters, and a light guide part located outward of the entrance part and configured to guide the light entering the entrance part. The upper face of the first lens includes a plurality of annular protruding portions.

12 Claims, 22 Drawing Sheets

Related U.S. Application Data continuation of application No. PCT/JP2020/034188, filed on Sep. 9, 2020.

(58) Field of Classification Search
CPC ... G02B 3/08; G02B 19/0028; G02B 19/0061
See application file for complete search history.

(56) References Cited

U.S. PATENT DOCUMENTS

| | | | |
|---|---|---|---|
| 7,142,769 B2 * | 11/2006 | Hsieh | G02B 6/0018 257/79 |
| 7,580,192 B1 | 8/2009 | Chu et al. | |
| 9,874,663 B2 | 1/2018 | Streppel | |
| 10,190,746 B1 | 1/2019 | Mao et al. | |
| 10,677,415 B1 | 6/2020 | Zhao | |
| 2002/0036839 A1 | 3/2002 | Kishima et al. | |
| 2007/0086204 A1 * | 4/2007 | Chinniah | F21V 5/04 362/520 |
| 2007/0263390 A1 | 11/2007 | Opolka et al. | |
| 2008/0037116 A1 | 2/2008 | Alasaarela et al. | |
| 2010/0232176 A1 | 9/2010 | Alasaarela et al. | |
| 2012/0063146 A1 | 3/2012 | Kawagoe et al. | |
| 2012/0120667 A1 | 5/2012 | Schenkl | |
| 2012/0210667 A1 | 8/2012 | Daniocek et al. | |
| 2013/0001605 A1 | 1/2013 | Ishihara et al. | |
| 2014/0307447 A1 | 10/2014 | Ohta et al. | |
| 2014/0316742 A1 | 10/2014 | Sun et al. | |
| 2015/0316228 A1 | 11/2015 | Saito | |
| 2016/0072996 A1 | 3/2016 | Rammah et al. | |
| 2016/0230953 A1 | 8/2016 | Wang et al. | |
| 2016/0348874 A1 | 12/2016 | Aruga | |
| 2017/0002997 A1 | 1/2017 | Huang et al. | |
| 2017/0184275 A1 | 6/2017 | Aruga | |
| 2018/0112848 A1 | 4/2018 | Streppel | |
| 2018/0187841 A1 | 7/2018 | Nakamura | |
| 2019/0280174 A1 | 9/2019 | Okahisa et al. | |
| 2020/0089059 A1 | 3/2020 | Nakamura | |
| 2020/0103582 A1 * | 4/2020 | Fattal | G02F 1/133605 |
| 2020/0271297 A1 | 8/2020 | Streppel | |
| 2022/0252238 A1 | 8/2022 | Yoshida et al. | |

FOREIGN PATENT DOCUMENTS

| | | |
|---|---|---|
| CN | 108397750 A | 8/2018 |
| JP | S63-106738 A | 5/1988 |
| JP | 2002-072037 A | 3/2002 |
| JP | 2002-532893 A | 10/2002 |
| JP | 2004-046053 A | 2/2004 |
| JP | 2009-218169 A | 9/2009 |
| JP | 2010-238837 A | 10/2010 |
| JP | 2011-096666 A | 5/2011 |
| JP | 2011-184468 A | 9/2011 |
| JP | 2012-049214 A | 3/2012 |
| JP | 2012-104256 A | 5/2012 |
| JP | 2012-174601 A | 9/2012 |
| JP | 2014-182994 A | 9/2014 |
| JP | 2015-507817 A | 3/2015 |
| JP | 2015-195170 A | 11/2015 |
| JP | 2016-194568 A | 11/2016 |
| JP | 2017-016995 A | 1/2017 |
| JP | 2017-103051 A | 6/2017 |
| JP | 2018-098162 A | 6/2018 |
| JP | 2018-152402 A | 9/2018 |
| JP | 2018-205349 A | 12/2018 |
| JP | 2019-160780 A | 9/2019 |
| WO | WO-2006/072885 A1 | 7/2006 |
| WO | WO-2011/055519 A1 | 5/2011 |
| WO | WO-2013/065408 A1 | 5/2013 |
| WO | WO-2013/088299 A1 | 6/2013 |
| WO | WO-2017/202670 A1 | 11/2017 |

OTHER PUBLICATIONS

Non-Final Office Action in U.S. Appl. No. 17/731,991 dated Feb. 16, 2023.
Non-Final Office Action in U.S. Appl. No. 17/731,945 dated Mar. 14, 2023.
Non-Final Office Action in U.S. Appl. No. 18/490,549 dated May 8, 2024.
Final Office Action in U.S. Appl. No. 18/490,549 on Aug. 21, 2024.
Non-Final Office Action in U.S. Appl. No. 18/490,549 dated Oct. 17, 2004.

* cited by examiner

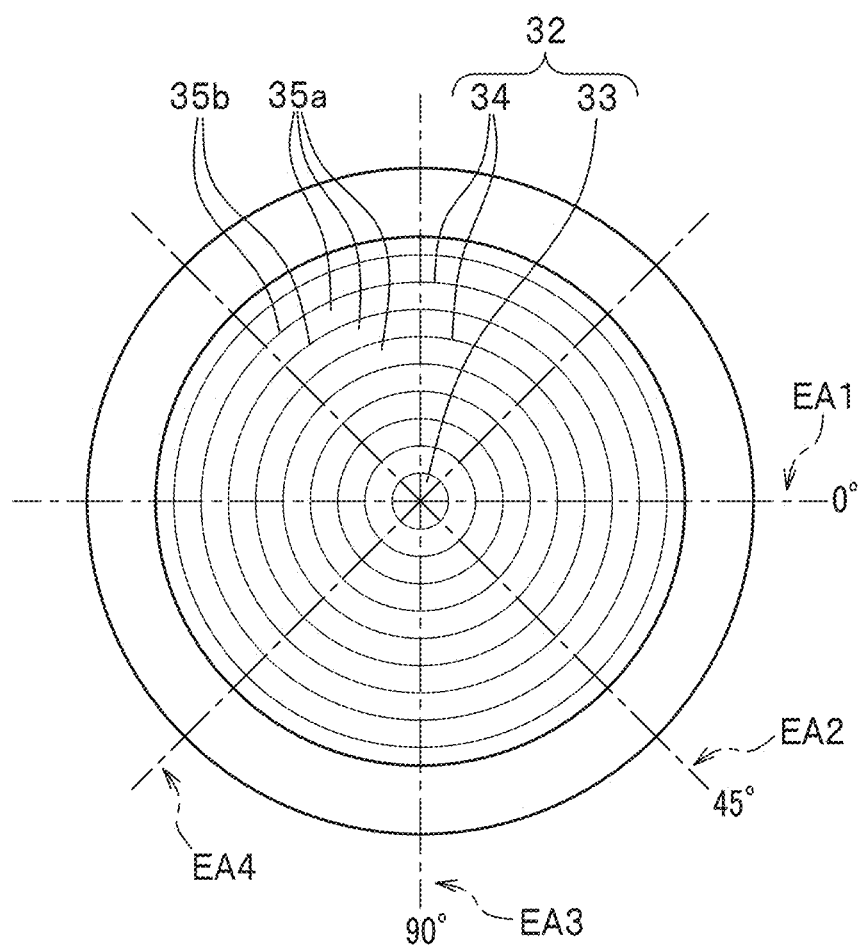

LIGHT SOURCE DEVICE

CROSS-REFERENCE TO RELATED APPLICATIONS

This is a continuation of U.S. patent application Ser. No. 17/731,991, filed on Apr. 28, 2022, which is a bypass continuation of PCT Application No. PCT/JP2020/034188, filed on Sep. 9, 2020, which claims priority to Japanese Patent Application No. 2019-197984, filed on Oct. 30, 2019, and Japanese Patent Application No. 2020-112022, filed on Jun. 29, 2020. The contents of these applications are hereby incorporated by reference in their entireties.

BACKGROUND

The present disclosure relates to a light source device.

Light sources using light emitting devices such as light emitting diodes are widely used. For example, Japanese Patent Publication No. JP 2010-238837 A discloses a small light source device that can be used as a flashlight in a cellular phone.

SUMMARY

One object of certain embodiments of the present disclosure is to achieve higher emission efficiency within a desired irradiation range.

According to one embodiment, a light source device includes a light emitting device having a light emission face in an upper face, a first lens disposed to face the light emitting device, and a second lens disposed to face the first lens, wherein a lower face of the first lens facing the light emitting device includes an entrance part provided in a center where light from the light emitting device enters, and a light guide part provided on an outside of the entrance part to guide the light entering the entrance part, while a lower face of the second lens facing the first lens includes a Fresnel lens face composed of a plurality of annular protruding portions.

According to another embodiment, a light source device includes a light emitting device having a light emission face in an upper face and a first lens disposed to face the light emitting device, wherein a lower face of the first lens facing the light emitting device include an entrance part provided in a center of the lower face where light from the light emitting device enters, and a light guide part provided on an outside of the entrance part to guide the light entering the entrance part, while the upper face of the first lens opposite to the lower face includes a Fresnel lens face composed of a plurality of annular protruding portions.

Advantageous Effects of Invention

According to certain embodiments of the present disclosure, a light source device achieving high emission efficiency within a desired irradiation range can be provided.

BRIEF DESCRIPTION OF THE DRAWINGS

FIG. 19A is a plan view illustrating a variation of the Fresnel lens face in the embodiments.

DETAILED DESCRIPTION

Figure 1:
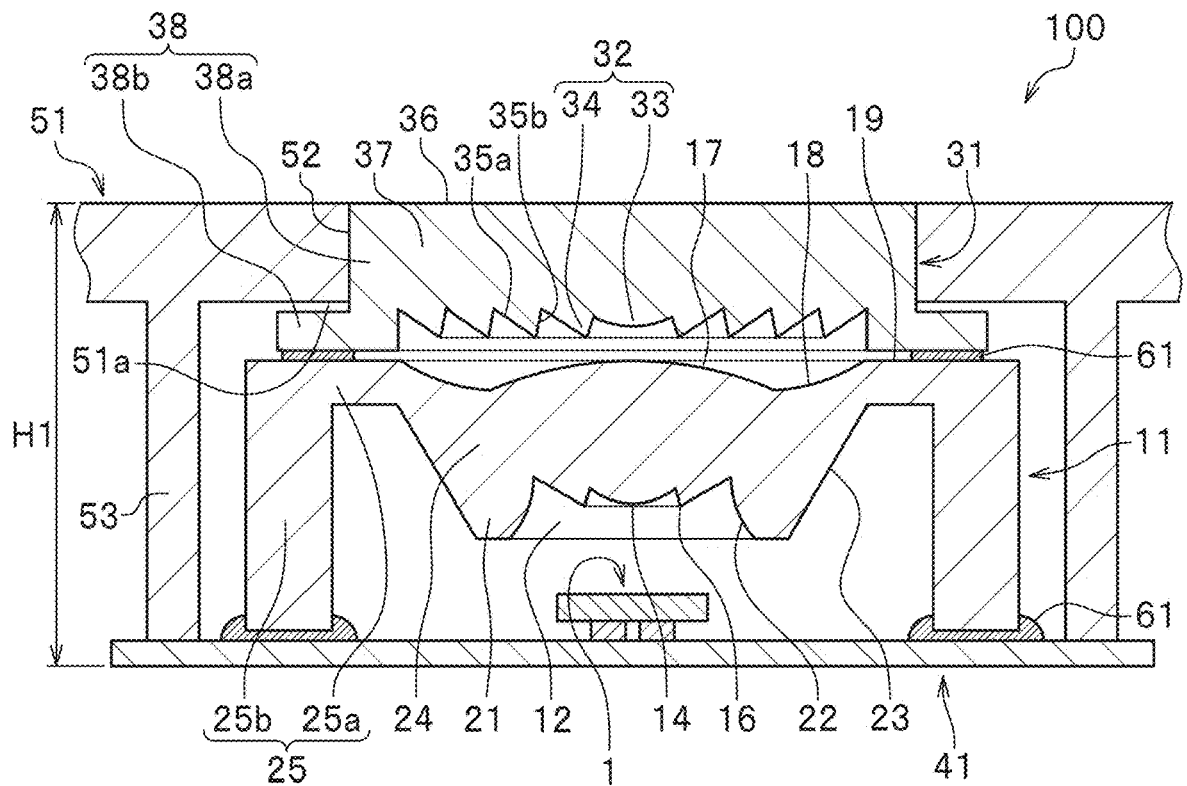
FIG. 1 is a cross-sectional view schematically showing the structure of a light source device according to a first embodiment.

Light source devices according to certain embodiments of the present invention will be explained with reference to the accompanying drawings. The light source devices described below, however, are examples for the purpose of giving shape to the technical ideas of the embodiments and are not intended to limit the present invention. Furthermore, the sizes, materials, shapes, and the relative positions of the constituent parts described in the embodiments are merely provided as explanatory examples without any intention of limiting the scope of the present invention unless otherwise specifically noted. The sizes of and the positional relationship between the members shown in each drawing may be exaggerated for clarity of explanation. In the description below, the same designations and reference numerals denote the same or similar members for which repeated detailed explanation will be omitted as appropriate.

First Embodiment

A light source device 100 according to a first embodiment, as shown in FIG. 1, includes a light emitting device 1 having a light emission face in the upper face, a first lens 11 disposed to face the light emitting device 1, and a second lens 31 disposed to face the first lens 11. The lower face of the first lens 11 facing the light emitting device 1 includes an entrance part 12 provided in the center of the lower face where the light from the light emitting device 1 enters. The lower face of the first lens 11 includes a light guide part 21 provided on the outside of the entrance part 12 to guide the light entering the entrance part 12, while the lower face of the second lens 31 facing the first lens 11 includes a Fresnel lens face 32 composed of a plurality of annular protruding portions 34.

Figure 4A:
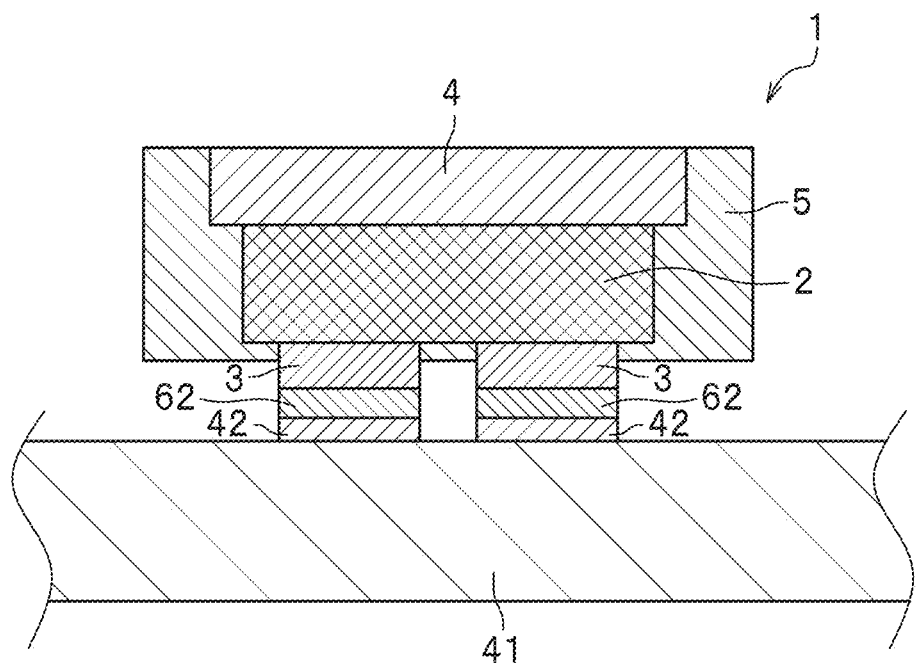
FIG. 4A is a cross-sectional view schematically showing one structure of the light emitting device in the light source device according to the first embodiment.
Figure 4B:
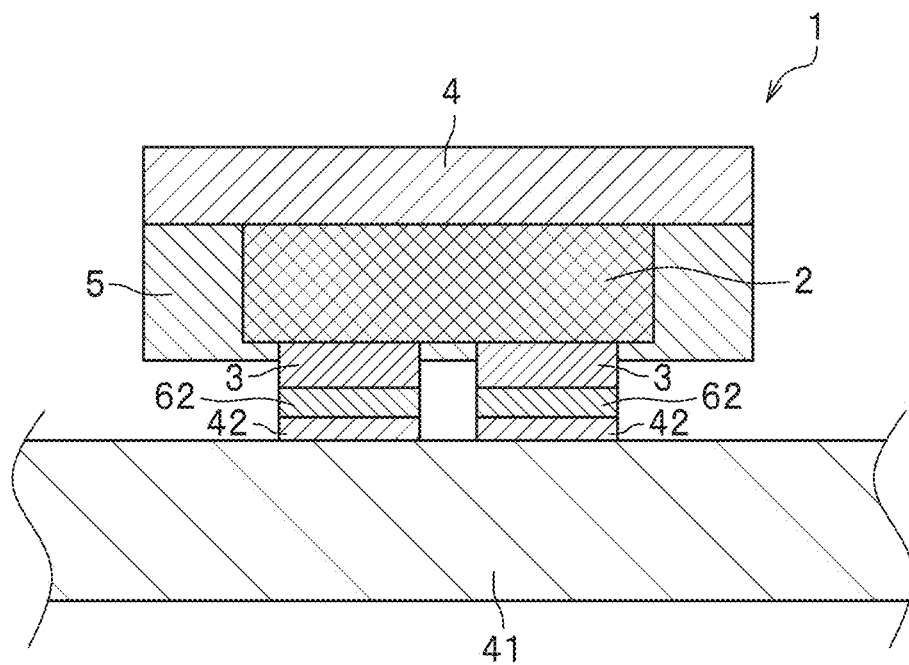
FIG. 4B is a cross-sectional view schematically showing another structure of the light emitting device in the light source device according to the first embodiment.

The light source device 100 can further include: a substrate 41 on which the light emitting device 1 is mounted; and a housing 51 that opposes an opening 52 to the second lens 31, and the first lens 11 is preferably fixed to the substrate 41. Furthermore, in the light source device 100, the second lens 31 is preferably fixed to the first lens 11 that is fixed to the substrate 41. Each constituent element of the light source device will be explained below.
Light Emitting Device A light emitting device 1, as shown in FIG. 4A, has a light emission face in the upper face and is mounted on a substrate 41 using the lower face opposite to the upper face as the mounting face. The light emitting device 1 includes a light emitting element 2, a light transmissive member 4 disposed on the upper face of the light emitting element 2, and a cover member 5 covering the lateral faces of the light emitting element 2 and the lateral faces of the light transmissive member 4 without covering the upper face of the light transmissive member 4. As shown in FIG. 4B, the lateral faces of the light transmissive member 4 can be exposed from the cover member 5. Positive and negative electrodes 3 are preferably disposed on the lower face of the light emitting element 2 opposite to the upper face. Moreover, the shape of the light emitting device 1 in a plan view, for example, is a square, but may alternatively be a circle, ellipse, or polygon, such as a triangle, hexagon, or the like.

A light emitting elements 2 is preferably formed of various semiconductors, such as group III-V compound semiconductors, II-VI compound semiconductors, or the like. For semiconductors, nitride-based semiconductors such as $In_xAl_yGa_{1-x-y}N$ ($0 \leq X$, $0 \leq Y$, $X+Y \leq 1$) are preferably used, and InN, AlN, GaN, InGaN, AlGaN, InGaAlN, or the like can also be used.

A light transmissive member 4 is a sheet-shaped member having a quadrilateral shape in a plan view and is disposed to cover the upper face of a light emitting element 2. The light transmissive member 4 can be formed by using a light transmissive resin material, an inorganic material such as a ceramic, glass, or the like. For resin materials, thermosetting resins, such as silicone resins, silicone modified resins, epoxy resins, phenol resins or the like can be used. Moreover, thermoplastic resins, such as polycarbonate resins, acrylic resins, methylpentane resins, polynorbornene resins or the like can also be used. Particularly, highly light resistant and heat resistant silicone resins or silicone modified resins are suited. Light transmissivity here refers to the property of transmitting at least 60% of the light from a light emitting element 2. Furthermore, the light transmissive member 4 may contain a light diffuser and/or a phosphor that coverts the wavelength of at least a portion of the light emitted from the light emitting element 2. Examples of a light transmissive member 4 containing a phosphor include the aforementioned resins, ceramics, glass, or the like, that contain a phosphor, a sintered body of a phosphor, and the like. The light transmissive member 4 containing a phosphor may be one having a resin layer containing a phosphor and/or a light diffuser formed on the lower face of a formed body of a resin, ceramic, glass, or the like.

For example, by employing a blue light emitting element for the light emitting element 2 and a light transmissive member 4 containing a yellow-emitting phosphor, a light emitting device 1 that emits white light can be obtained.

Examples of phosphors to be contained in the light transmissive member 4 include yellow phosphors, such as YAG phosphors exemplified by $Y_3Al_5O_{12}$:Ce, silicate, and the like, and red phosphors such as CASN phosphors exemplified by $CaAlSiN_3$:Eu, KSF phosphors exemplified by $K_2SiF_6$:Mn, and the like.

For the light diffuser to be contained in the light transmissive member 4, for example, titanium oxide, barium titanate, aluminum oxide, silicon oxide, or the like can be used.

A cover member 5 directly or indirectly covers the lateral faces of the light emitting element 2 and the lateral faces of the light transmissive member 4. The upper face of the light transmissive member 4 exposed from the cover member 5 constitutes the light emission face (i.e., the primary light extraction face) of a light emitting device 1. The cover member 5 is preferably composed of a highly reflective material in order to increase the light extraction efficiency. For the cover member 5, for example, a resin material containing a light reflecting substance such as a white pigment can be used. Examples of light reflecting substances include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, silicon oxide, and the like. It is preferable to use one of these singly or in combination of two or more. A resin material preferably has the base material employing as a primary component a thermosetting resin, such as an epoxy resin, silicone resin, silicone modified resin, phenol resin, or the like.

The cover member 5 may be composed of a material that transmits visible light as needed.

First Lens

A first lens 11 is disposed to face the light emitting device 1. The first lens 11 collects the light from the light emitting device 1 and allows the light to exit as collimated light towards the second lens 31. The first lens 11 is preferably a collimating lens, for example. The first lens 11 is preferably formed with a light transmissive resin, such as a polycarbonate resin, acrylic resin, silicone resin, epoxy resin, or the like. The plan view shape of the first lens 11 is preferably circular or elliptical, but may be polygonal, such as a square, hexagon, or the like.

The first lens 11 includes, in the lower face facing the light emitting device 1, an entrance part 12 provided in the center where the light from the light emitting device 1 enters, and a light guide part 21 provided concentrically around the entrance part 12 to guide the light entering the entrance part 12.

An entrance part 12 is a concave portion formed in the lower face of the first lens 11 sized to enclose the light emitting device 1 in a plan view. The plan view shape of the bottom face of the concave entrance part 12 is preferably circular or elliptical, but may alternatively be triangular, quadrangular, hexagonal, or the like. Here, the bottom face of the concave portion is preferably formed as a Fresnel lens face. In other words, the entrance part 12 preferably includes a lower face convex portion 14 provided in the center and protruding towards the light emitting device 1, and an angular portion 16 concentrically provided around the lower face convex portion 14 and protruding towards the light emitting device 1. Furthermore, the angular portion 16 is preferably provided concentrically around the lower face convex portion 14 continuously or intermittently. The angular portion 16 here is concentrically formed to go around once, but may be formed to go around multiple times. Providing the angular portion 16 can reduce the radius of the lower face convex portion 14, allowing the light from the light emitting device 1 to be refracted into collimated light to a greater extent to thereby improve the light collecting performance. The inner lateral face 22 of the concave portion is preferably a curved face, but may be a flat face.

A light guide part 21 is provided on the outside of the entrance part 12 on the lower face side of the first lens 11. The light guide part 21 has an oblique face 23 to reflect the light entering the entrance part 12 into collimated light. The light guide part 21 preferably has an annular shape continuously or intermittently formed concentrically around the entrance part 12. This allows the light guide part 21 to collect the portion of the light emitted from the light emitting device 1 having a large angle of emergence and advancing out of a desired irradiation range, thereby improving the light extraction efficiency. The angle of inclination of the oblique face 23 relative to the optical axis is suitably set such that the light from the light emitting device 1 is collected and incident to reflect as collimated light.

Figure 2:
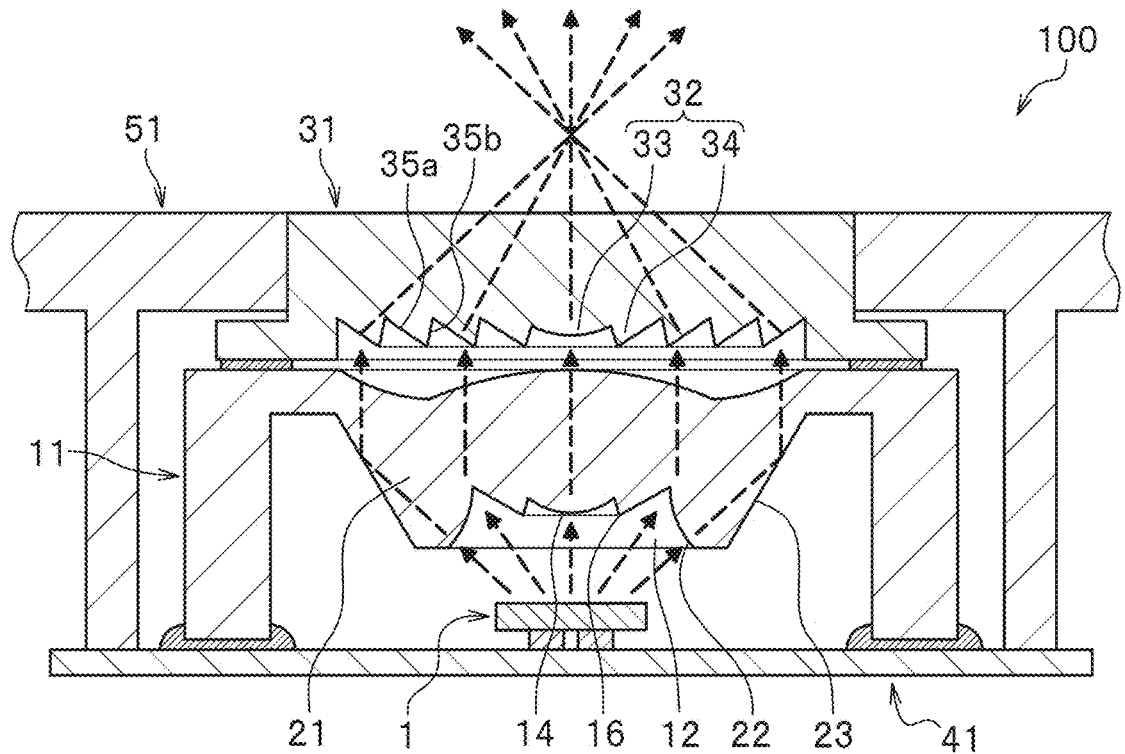
FIG. 2 is a cross-sectional view schematically showing the optical paths of the light source device according to the first embodiment.

As shown in FIG. 2, the exiting light from the light emission face of the light emitting device 1 advancing in a direction along the optical axis enter the lower face convex portion 14 of the entrance part 12 of the first lens 11, and advances straight to exit towards the second lens 31. The exiting light from the light emission face of the light emitting device 1 advancing at a relatively small angle relative to the optical axis enter the lower face convex portion 14 or the angular portion 16 to be refracted into light parallel to the optical axis before exiting towards the second lens 31. The light exiting from the light emission face of the light emitting device 1 advancing at a relatively large angle relative to the optical axis enter the inner lateral face 22 of the concave portion and reflected by the oblique face 23 of the light guide 21 before exiting as parallel light to the optical axis direction towards the second lens 31.

The upper face of the first lens 11 has an upper face convex portion 17 provided in the center and protruding towards the second lens 31, an upper face concave portion 18 that is contiguous with the upper face convex portion 17, and a flat portion 19 provided around the upper face convex portion 17 via the upper face concave portion 18. The upper face concave portion 18 preferably has a gently curved annular concave face formed concentrically around the upper face convex portion 17. The upper face convex portion 17 is preferably formed larger than the lower face convex portion 14 in a plan view. The first lens 11 having the upper face convex portion 17 can bring the light refracted after entering the lower face convex portion 14 and/or the angular portion 16 of the entrance part 12 closer to light parallel to the optical axis direction. This can facilitate the optical control achieved by the Fresnel lens face 32 of the second lens 31, thereby increasing the light extraction efficiency. Moreover, the first lens 11 having the upper face concave portion 18 can facilitate extraction of the light reflected by the oblique face 23 towards the second lens. Although the oblique face 23 of the first lens 11 can bring the exiting light from the light emitting device 1 closer to light parallel to the optical axis direction as described above, further including the upper face concave portion 18 allows the inclination angle of the oblique face 23 relative to the optical axis to be reduced further. This can also reduce the lens diameter of the first lens 11, which in turn can reduce the lens diameter of the second lens 31. This in turn can reduce the diameter of the opening 52 of the housing 51. Accordingly, the interior is less visible through the opening 52 to thereby improve the external appearance quality.

Figure 5:
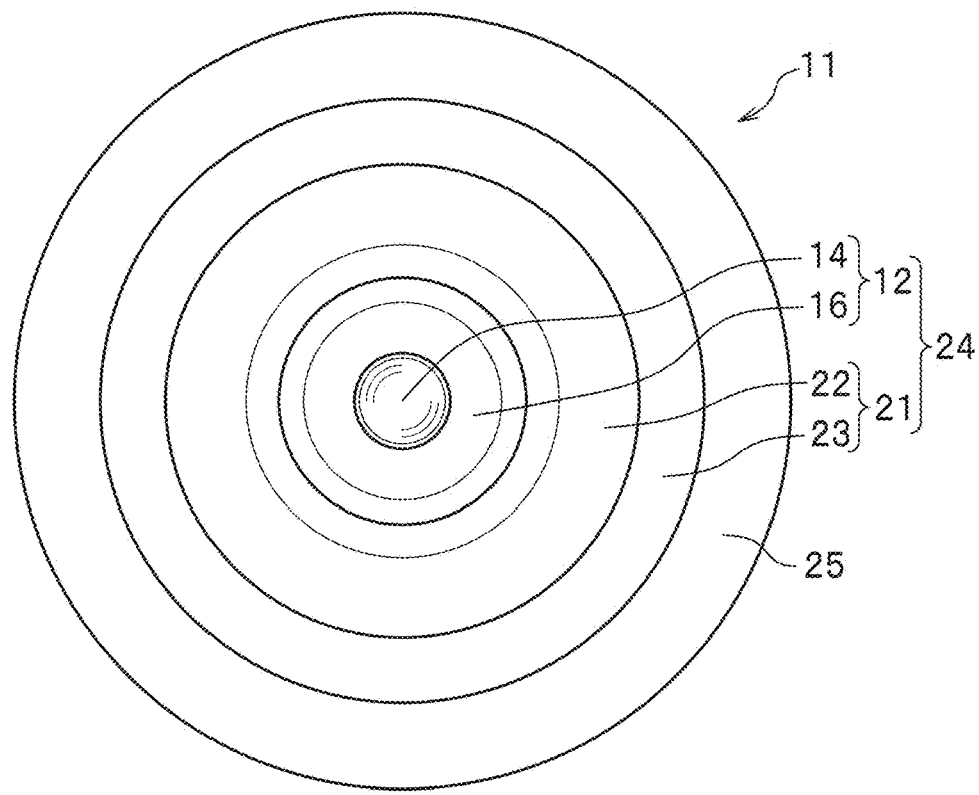
FIG. 5 is a plan view of a first lens in the light source device according to the first embodiment when viewed from the light emitting device side.

The first lens 11, as shown in FIG. 5, includes a first main body 24 that includes the entrance part 12 and the light guide part 21, and a first marginal part 25 extending laterally from the periphery of the first main body 24, in which the first marginal part 25 more preferably includes a first upper portion 25a and a first leg portion 25b extending from the first upper portion 25a towards the substrate 41. The first upper portion 25a is formed so as to extend laterally from the periphery of the first main body 24 and have an annular shape surrounding the first main body 24. The first upper portion 25a is formed to have a flat top and the same height as the upper end of the upper face convex portion 17 of the first main body 24. The first leg portion 25b, as one example, has a tubular shape contiguous with the first upper portion 25a. This allows the first lens 11 to have the lower face of the first leg portion 25b of the first marginal part 25 fixed to the upper face of the substrate 41 via an adhesive material 61, while fixing the upper face of the first upper portion 25a of the first marginal part 25 to the lower face of the second lens 31 via an adhesive material 61. Here, known bonding materials such as adhesive tape can be used as the adhesive material 61. As one example, the first main body 24 and the first marginal part 25 of the first lens 11 are integrally formed by processing a single material. The first main body 24 and the first marginal part 25 may be formed with different materials; for example, the first main body 24 can be formed with a resin or glass material that transmits light, and the first marginal part 25 can be formed with a metal such as an aluminum alloy or the like.

Second Lens

A second lens 31 is disposed to face the first lens 11 to refract the light from the first lens 11 to exit in a desired irradiation range. The second lens 31, similar to the first lens 11, is preferably formed with a light transmissive resin, such as a polycarbonate resin, acrylic resin, silicone resin, epoxy resin, or the like. The outer shape of the second lens 31 is preferably circular or elliptical in a plan view, but may be polygonal, such as a quadrangle, hexagon, or the like.

The second lens 31 is preferably a Fresnel lens having protruding or depressed portions. The lower face of the second lens 31 facing the first lens 11 includes a Fresnel lens face 32 composed of a plurality of annular protruding portions 34. The Fresnel lens face 32 includes a central convex portion 33 protruding towards the first lens 11 and a plurality of annular protruding portions 34 concentrically provided around the central convex portion 33 and protruding towards the first lens 11. The annular protruding portions 34 are preferably formed concentrically with the central convex portion 33 in a plan view and annularly along the shape of the central convex portion 33. In other words, the protruding portions 34 are formed into an annular shape in a plan view if the central convex portion 33 is circular in a plan view, and into a rectangular annular shape in a plan view if the central convex portion 33 is a rectangle in a plan view. The Fresnel lens face 32 is in preferable size to enclose the entrance part 12 and the light guide part 21 of the first lens 11 in a plan view.

The Fresnel lens face 32 of the second lens 31 has, as a plurality of annular protruding portions 34, a plurality of Fresnel faces 35a where the light from the first lens 11 enter, and rise faces 35b located between the Fresnel faces 35a. In the Fresnel lens face 32, the Fresnel faces 35a primarily have the optical function, and by adjusting the angles of the Fresnel faces 35a relative to the optical axis of the lens, the incident light from the Fresnel face 35a can be refracted at a desired angle. The cross-sectional shapes of the Fresnel faces 35a and the rise faces 35b may be straight lines, or curved lines protruding or depressed inwards.

Among the light exiting the first lens 11 that enter the second lens 31, the light exiting the central portion of the first lens 11 enter the central convex portion 33 of the second lens 31 and exit in the optical axis direction and the light collecting direction. The light exiting the non-central portion of the first lens 11 enter the protruding portions 34 and exit in a desired irradiation range. In other words, the light exiting the first lens 11 enter the second lens 31 as light substantially parallel to the optical axis. Accordingly, allowing the second lens 31 to refract the light entering the entrance lens faces 35 of the protruding portions 34 such that the light exit in a desired irradiation range, the emission efficiency of the light source device 100 can be improved.

Figure 6:
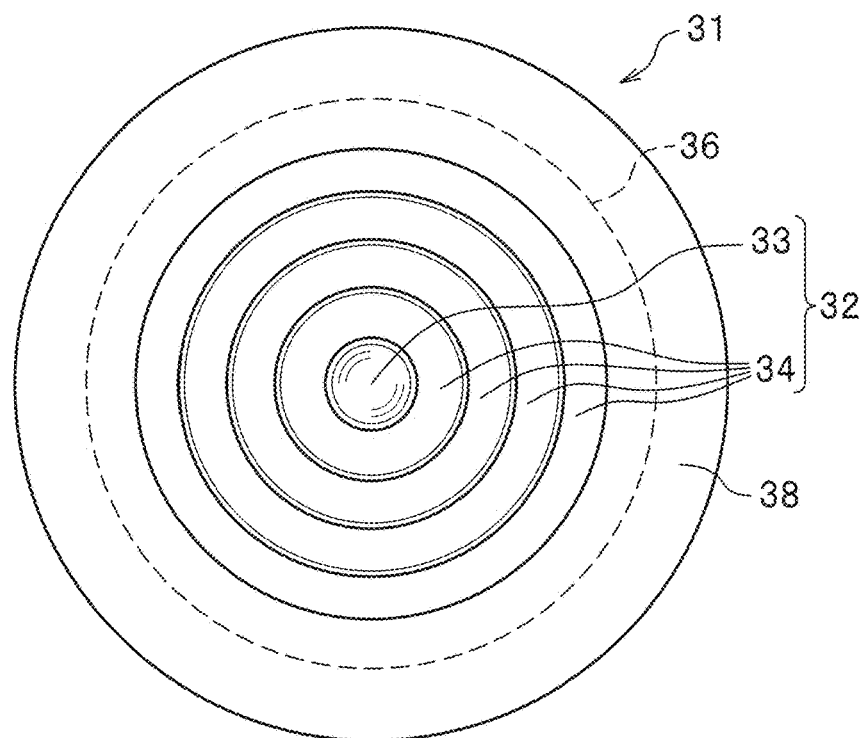
FIG. 6 is a plan view of a second lens in the light source device according to the first embodiment when viewed from the first lens side.

The second lens 31 preferably includes, in addition to the Fresnel lens face 32, a second main body 37, on the opposite side to the Fresnel lens face 32, having a flat face 36 that faces the opening 52 of a housing 51, and a second marginal part 38 extending laterally from the periphery of the second main body 37 as shown in FIG. 6. The second marginal part 38 preferably includes a second leg portion 38a extending from the periphery of the second main body 37 towards the first lens 11 and a second attaching portion 38b extending laterally from and contiguous with the lower end of the second leg portion 38a. The flat face 36 is formed to have at least the same size as that of the Fresnel lens face 32 in a plan view, and the same height as the upper face of the housing 51 when the second main body 37 is inserted into the opening 52 of the housing 51.

Figure 3:
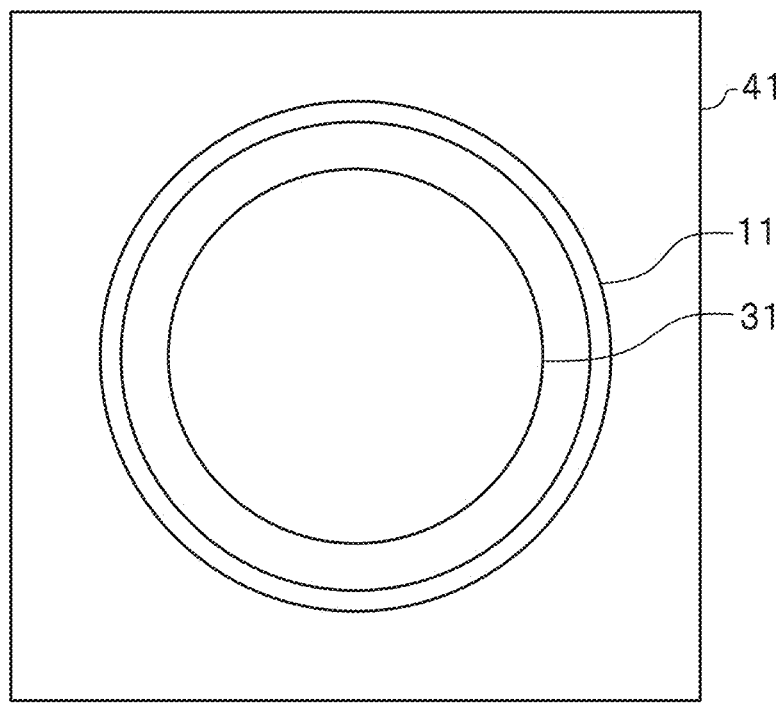
FIG. 3 is a plan view of the light source device according to the first embodiment, in which no housing is shown, when viewed from the second lens side.

The second marginal part 38 is formed to extend from the second main body 37 and be annular such that the upper face is coplanar with the flat face 36. The second leg portion 38a is formed such that the lower end face is positioned lower than the lower face of the Fresnel lens face 32. The second attaching portion 38b is formed to laterally extend from the lower lateral face of the second leg portion 38a and be annular. The second attaching portion 38b is formed such that the lower end is flat and coplanar with the lower end of the second leg portion 38a. The second attaching portion 38b is preferably arranged to face the first upper portion 25a of the first lens 11. This allows the upper face of the first marginal part 25 to be fixed to the lower face of the second marginal part 38 via an adhesive material 61. The second leg portion 38a of the second lens 31 is formed closer to the center than the first upper portion 25a of the first lens 11. In other words, as shown in FIG. 3, the second lens 31 is fixed so as to be enclosed by the first lens 11 in a plan view.

By positioning the lower face of the second leg portion 38a of the second lens 31 lower than the Fresnel lens face 32, the two lenses can be arranged such that the first main body 24 of the first lens 11 and the second main body 37 of the second lens 31 are spaced apart. This can reduce the interference between the first lens 11 and the second lens 31.

Furthermore, the second lens 31 is preferably inserted into the opening 52 of the housing 51 while exposing the flat face 36 of the second main body 37 and bringing the outer circumferential surface of the second leg portion 38a into contact the inner circumferential surface of the opening 52. Furthermore, in the light source device 100, the lower face of the second marginal part 38 of the second lens 31 is preferably fixed to the upper face of the first marginal part 25 of the first lens 11 via an adhesive material 61.

Substrate

A substrate 41 is a member on which a light emitting device 1 is mounted, and preferably includes wiring 42 disposed on the surface and/or inside thereof. The substrate 41, when the wiring 42 and the positive and negative electrodes 3 of the light emitting device 1 are connected via a conductive adhesive material 62, is electrically connected to the light emitting device 1. The structure, size, and the like of the wiring 42 of the substrate 41 are set according to the structure and size of the electrodes 3 of the light emitting device 1.

For the substrate 41, it is preferable to use an insulating material that barely transmits the light emitted from the light emitting device 1 or the light from the outside while having a certain degree of strength. Specifically, the substrate 41 can be structured with a ceramic material, such as alumina, aluminum nitride, mullite, or the like, or a resin material, such as a phenol resin, epoxy resin, polyimide resin, BT (bismaleimide triazine) resin, polyphthalamide, or the like.

Wiring 42 can be formed using copper, iron, nickel, tungsten, chromium, aluminum, silver, gold, titanium, palladium, rhodium, or an alloy of these. Furthermore, for the outer layer of the wiring 42, a layer of silver, platinum, aluminum, rhodium, gold, or an alloy of these may be disposed from the perspective of the wettability and/or the reflectivity of the conductive adhesive material 62.

Housing

A housing 51 covers the lenses while facing an opening 52 to the second lens 31, and may be, for example, a portion of the housing of a cellular phone in which the light source device 100 is used as the light source for the flashlight. The opening 52 is preferably larger in size than the second main body 37 of the second lens 31 to expose the flat face 36 of the second main body 37. The housing 51 may include a leg portion 53 to be fixed to the substrate 41. The housing 51 is preferably made of a light shielding material, for example, preferably structured using a resin material containing a filler, such as a light reflecting material, light absorbing material, or the like, so as to restrict the light distribution directions of the light exiting from the light source device 100. Examples of the plan view shape of the opening 52 include a circle, ellipse, triangle, rectangle, hexagon, and the like.

With the first lens 11, the light source device 100 can collect the light from the light emitting device 1 and allows light to exit as collimated light. The light collected by the first lens 11 enter the Fresnel lens face 32 of the second lens 31 and exit in a desired irradiation range. As a result, the emission efficiency of the light source device 100 can be increased because light can be collected into a desired irradiation range without any loss. In the light source device 100, the second lens 31 disposed on the emission (top) face side includes a Fresnel lens face 32. This can make the light emitting device 1 located in the light source device 100 less visible to thereby improve the external appearance quality.

In the case of a light source device 100, as described above, the first lens 11 is fixed to the substrate 41, and the second lens 31 having the second main body 37 inserted into the opening 52 of the housing 51 is fixed to the first lens 11 that is fixed to the substrate 41. This can reduce the device thickness H1 of the light source device 100 when used as a light source for the flashlight in a cellular phone or the like. This in turn can contribute to thickness reduction of a cellular phone.

Second Embodiment

Figure 7:
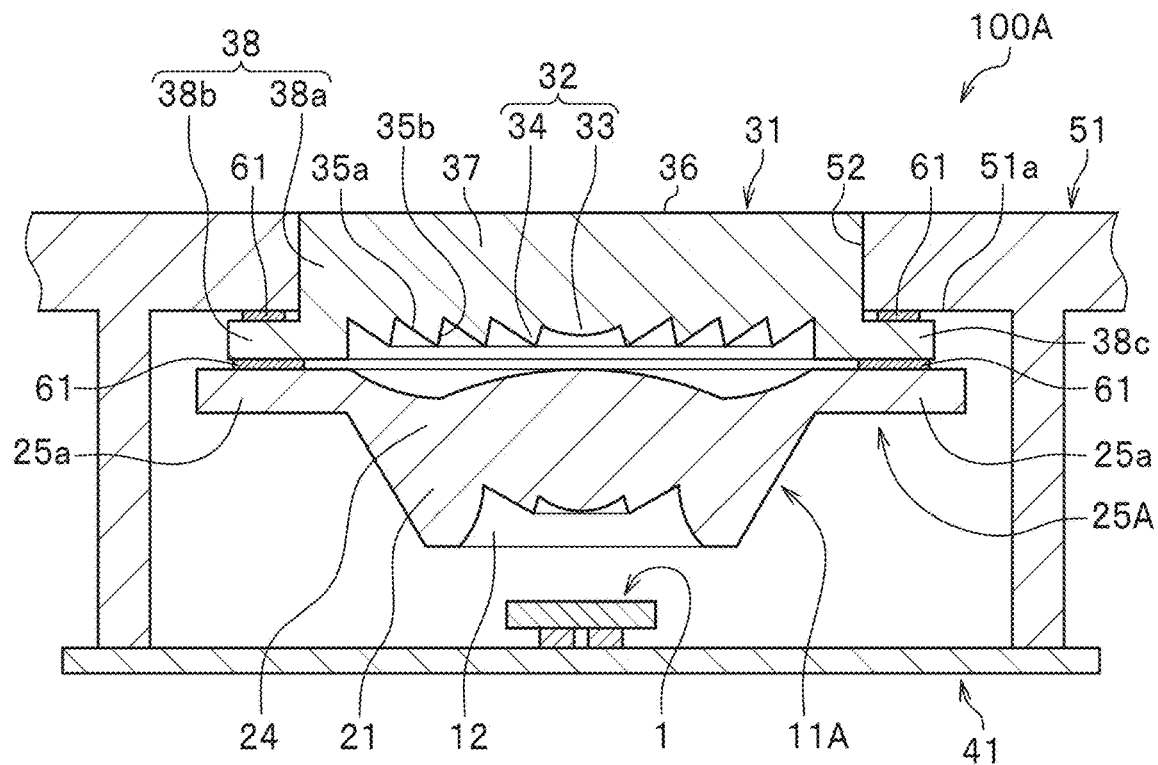
FIG. 7 is a cross-sectional view schematically showing the structure of a light source device according to a second embodiment.

FIG. 7 is a cross-sectional view schematically showing the structure of a light source device according to a second embodiment.

The light source device 100A according to the second embodiment includes features that are identical to those of the light source device 100 according to the first embodiment except that the second lens 31 is fixed to the housing 51 and the first marginal part 25 of the first lens 11A is composed only of a first upper portion 25a. The differences from the light source device 100 will primarily be explained below while omitting the identical features as appropriate.

The light source device 100A includes a substrate 41 on which a light emitting device 1 is mounted, a housing 51 facing the opening 52 to a second lens 31, and a first lens 11A disposed to face the second lens 31. The first lens 11A includes a first main body 24, which has an entrance part 12 and a light guide part 21, and a first marginal part 25A extending laterally from the periphery of the first main body 24. The first marginal part 25A has a first upper portion 25a. The first lens 11A is disposed spaced apart from the substrate 41 while connecting the first upper portion 25a to the second attaching portion 38b of the second lens 31 via an adhesive material 61. This can reduce the distance from the first lens 11A to the light emitting device 1, thereby allowing the entire device to have a smaller thickness. This can also improve manufacturing efficiency because the first lens 11A and the second lens 31 are bonded together when being attached to the housing 51. The optical axes of the first lens 11A and the second lens 31 can be aligned before being attached to the housing 51, making it easy to adjust the relative positions and reduce misalignment between the optical axis of the first lens 11A and the optical axis of the second lens 31. This can also reduce the appearance quality degradation attributable to misaligned lenses.

Third Embodiment

Figure 8:
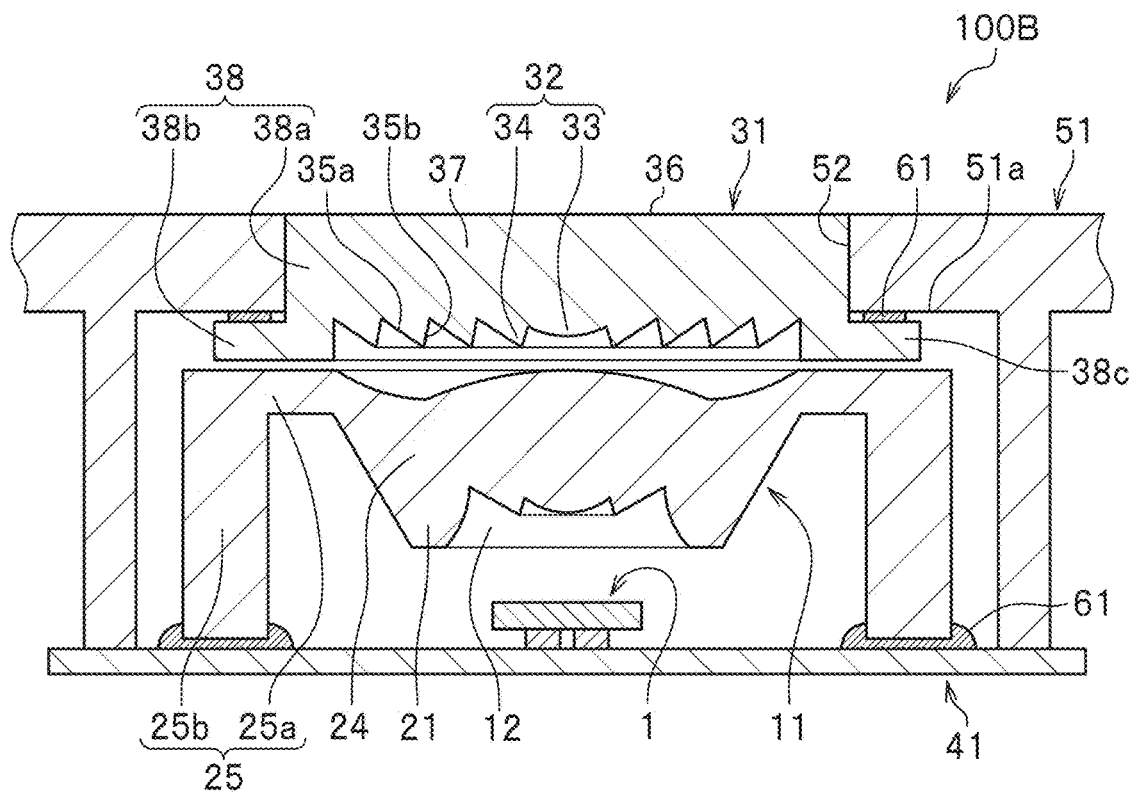
FIG. 8 is a cross-sectional view schematically showing the structure of a light source device according to a third embodiment.

FIG. 8 is a cross-sectional view schematically showing the structure of a light source device according to a third embodiment.

The light source device 100B according to the third embodiment includes features that are identical to those of the light source device 100 according to the first embodiment except that the first lens 11 is fixed to the substrate 41 and the second lens 31 is fixed to the housing 51, i.e., the first lens 11 and the second lens 31 are not fixed to each other.

The light source device 100B has the upper face of the second attaching portion 38b of the second lens 31 attached to the housing lower face 51a via an adhesive material 61, while attaching the lower face of the first leg portion 25b of the first lens 11 to the substrate 41 via an adhesive material 61. Attaching the first lens 11 to the substrate 41, and the second lens 31 to the housing 51, in this manner can increase the flexibility in the manufacturing operations for the light source device 100B.

Fourth Embodiment

Figure 9:
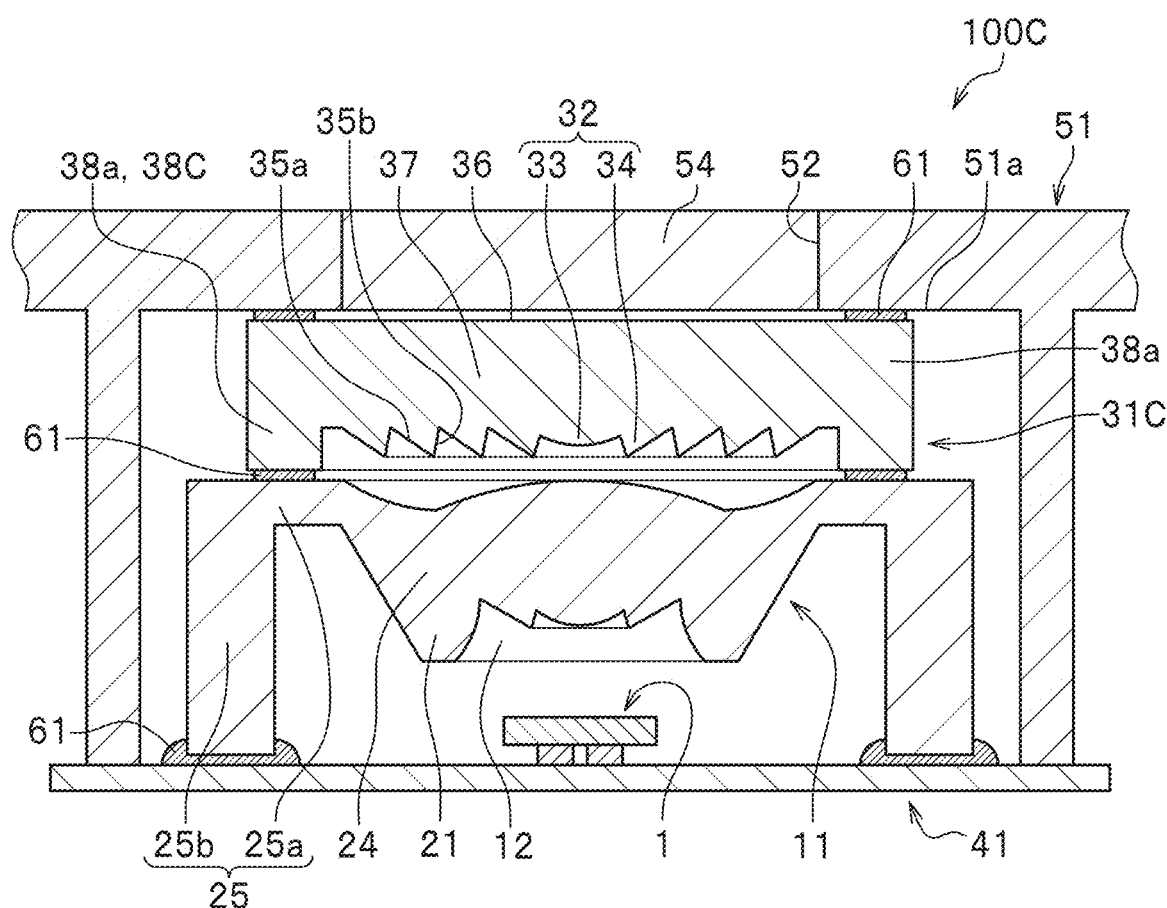
FIG. 9 is a cross-sectional view schematically showing the structure of a light source device according to a fourth embodiment.

FIG. 9 is a cross-sectional view schematically showing the structure of a light source device according to a fourth embodiment.

The light source device 100C according to the fourth embodiment includes features that are identical to those of the light source device 100 according to the first embodiment except that a transparent member 54 is incorporated in the opening 52 of the housing 51 and the second marginal part 38C of the second lens 31C is substantially composed only of a second leg portion 38a. The transparent member 54 is preferably formed of glass, transparent resin, or the like.

The light source device 100C includes a substrate 41 on which a light emitting device 1 is mounted, a housing 51 having an opening 52, a first lens 11, and a second lens 31C, where a transparent member 54 is incorporated in the opening 52. The light source device 100C is such that the center of the first lens 11 and the center of the second lens 31 are positioned at the center of the transparent member 54. The second lens 31C includes a Fresnel lens face 32, a second main body 37 having a flat face 36 on the opposite side to the Fresnel lens face 32, and a second marginal part 38C extending laterally from the periphery of the second main body 37.

A second leg portion 38a extending laterally from the periphery of the second main body 37 is included as the second marginal part 38C. The second leg portion 38a is formed such that the lower end face is positioned lower than the Fresnel lens face 32. The second leg portion 38a is formed into a tubular shape along the outer periphery of the second main body 37. The second leg portion 38a is formed so as to face the lower end face to the first upper portion 25a of the first lens 11.

The second lens 31C is connected to the housing 51 by bonding the upper face of the second leg portion 38a and the housing lower face 51a via an adhesive material 61, and to the first lens 11 by bonding the lower end face of the second leg portion 38a and the first upper portion 25a of the first lens 11 via an adhesive material 61. The first lens 11 is fixed to the substrate 41 by bonding the upper face of the substrate 41 and the lower face of the first leg portion 25b via an adhesive material 61.

In the light source device 100C provided with a transparent member 54 as a protective member, the flat face 36 of the second lens 31 is not exposed from the housing 51, thereby reducing degradation. When the light source device 100C is used as a light source for the flashlight of a cellular phone, the light emitting device 1 is less visible from the outside because the transparent member 54, the second lens 31, and the first lens 11 are interposed, which can improve the external appearance quality. In the light source device 100C, the parts are bonded using an adhesive material 61 at a number of locations. Thus, dislocations of parts attributable to shocks can be suppressed.

Fifth Embodiment

Figure 10:
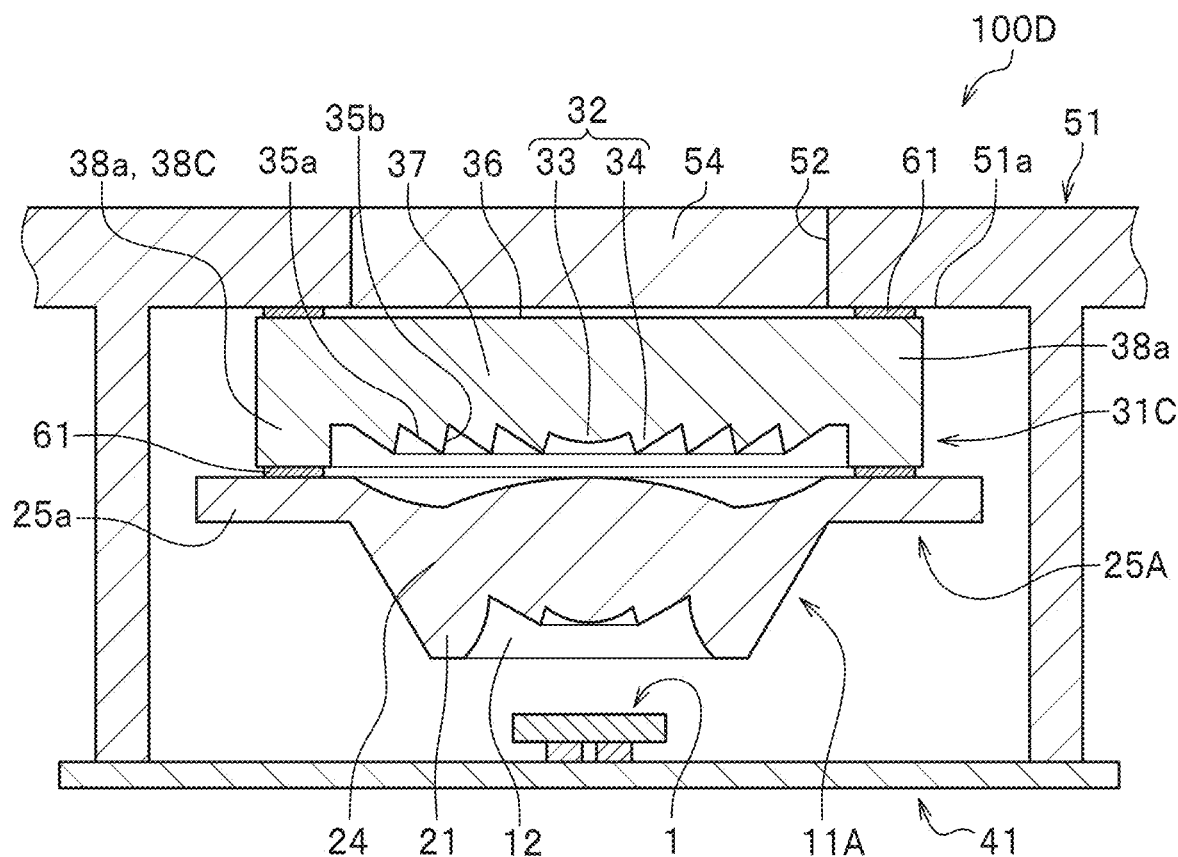
FIG. 10 is a cross-sectional view schematically showing the structure of a light source device according to a fifth embodiment.

FIG. 10 is a cross-sectional view schematically showing the structure of a light source device 100D according to a fifth embodiment.

The light source device 100D according to the fifth embodiment includes features that are identical to those of the light source device 100C according to the fourth embodiment except that the second lens 31C is fixed to the housing 51, and the first marginal part 25A of the first lens 11 is substantially composed only of a first upper portion 25a.

The light source device 100D includes a substrate 41 on which a light emitting device 1 is mounted, a housing 51 that faces an opening 52 to a second lens 31C, a first lens 11A disposed to face the second lens 31C, where a transparent member 54 is incorporated in the opening 52. The first lens 11A includes a first main body 24, which has an entrance part 12 and a light guide part 21, and a first marginal part 25A extending laterally from the periphery of the first main body 24. The first marginal part 25A is substantially formed only of a first upper portion 25a. Furthermore, the second lens 31C has a Fresnel lens face 32, a second main body 37 having a flat face 36 on the opposite side to the Fresnel lens face 32, and a second marginal part 38C extending laterally from the periphery of the second main body 37. The second marginal part 38C includes a second leg portion 38a extending laterally from the periphery of the second main body 37.

Moreover, the second lens 31C is fixed to the housing 51 by bonding the upper face of the second leg portion 38a and the housing lower face 51a in the periphery of the opening 52 via an adhesive material 61 such that the flat face 36 of the second main body 37 faces the transparent member 54. The second lens 31C is also fixed to the first lens 11A by bonding the lower face of the second leg portion 38a of the second marginal part 38C and the upper face of the first upper portion 25a of the first marginal part 25A via an adhesive material 61. The first lens 11A and the second lens 31C are preferably arranged such that the center of the transparent member 54, the optical axis of the first lens 11A, and the optical axis of the second lens 31C are aligned.

In the case of a light source device 100D, the first lens 11A and the second lens 31C are bonded together by an adhesive material 61 when being attached to the housing lower face 51a of the housing 51 to face the transparent member 54. Accordingly, the work efficiency is increased.

Furthermore, the relative positions of the first lens 11A and the second lens 31C can be easily adjusted in conformance with the position of the opening 52 to thereby reduce misalignment with the opening 52 and degradation of the external appearance quality attributable to misalignment.

Sixth Embodiment

Figure 11:
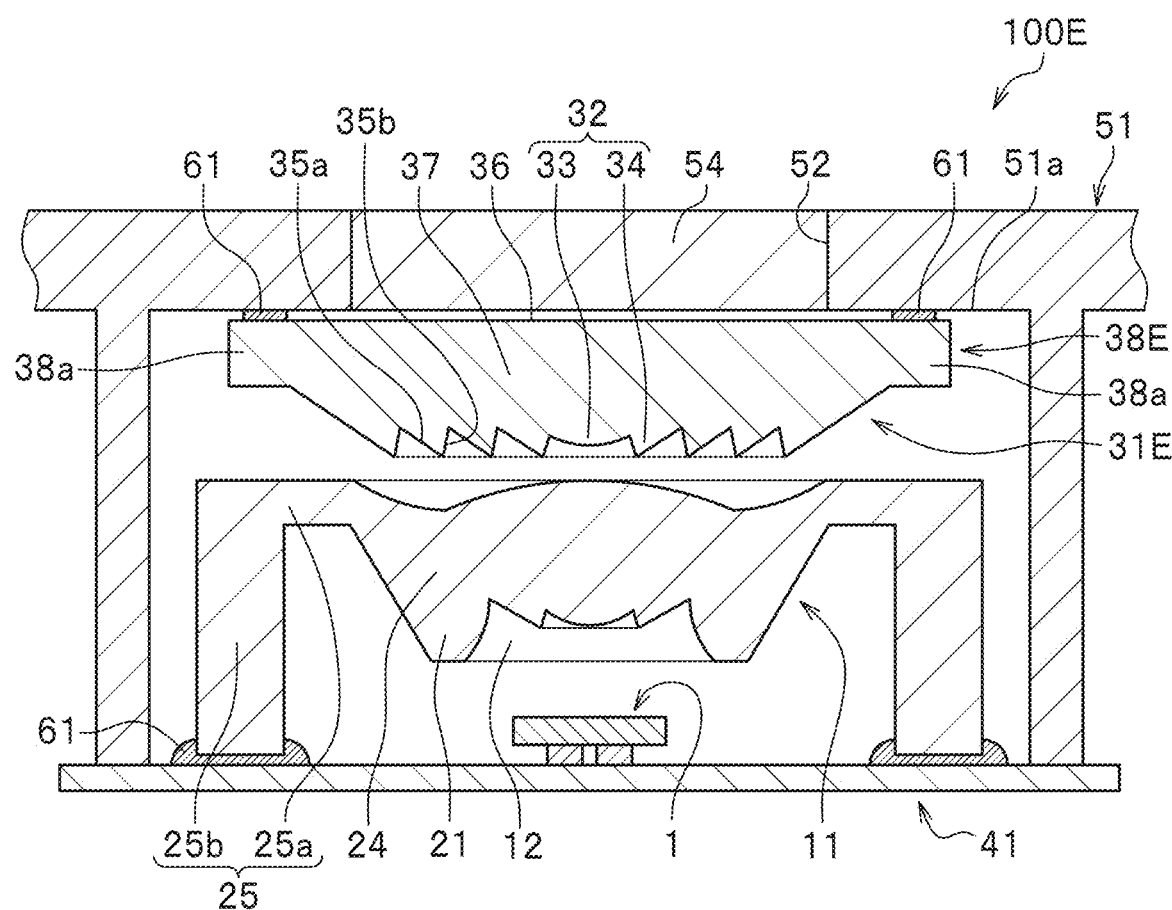
FIG. 11 is a cross-sectional view schematically showing the structure of a light source device according to a sixth embodiment.

FIG. 11 is a cross-sectional view schematically showing the structure of a light source device 100E according to a sixth embodiment.

The light source device 100E according to the sixth embodiment includes features that are identical to those of the light source device 100C according to the fourth embodiment except that the first lens 11 is fixed to the substrate 41, the second lens 31E is fixed to the housing 51, the second marginal part 38E of the second lens 31 is substantially composed only of a second leg portion 38a, and the locations bonded by an adhesive material 61 are different.

The light source device 100E includes a substrate 41 on which a light emitting device 1 is mounted, a housing 51 that faces an opening 52 to the second lens 31E, and a first lens 11 disposed to face the second lens 31E, where a transparent member 54 is incorporated in the opening 52. The first lens 11 includes a first main body 24, which has an entrance part 12 and a light guide part 21, and a first marginal part 25 extending laterally from the periphery of the first main body 24. The first marginal part 25 includes a first upper portion 25a extending laterally from the periphery of the first main body 24 and a first leg portion 25b extending from the first upper portion 25a towards the substrate 41.

The second lens 31E has a Fresnel lens face 32, a second main body 37 having a flat face 36 on the opposite side to the Fresnel lens face 32, and a second marginal part 38 extending laterally from the periphery of the second main body 37. The second lens 31E is disposed such that the flat face 36 of the second main body 37 faces the transparent member 54. In the second marginal part 38E, the lower face of the second leg portion 38a is positioned higher than the Fresnel lens face 32. The second leg part 38a is formed to laterally extend from the periphery of the second main body 37 and have a predetermined thickness. The second lens 31E is fixed to the housing by bonding the housing lower face 51a in the periphery of the opening 52 and the upper face of the second leg portion 38a via an adhesive material 61.

The first lens 11 is fixed to the substrate 41 by bonding the upper face of the substrate 41 and the lower face of the first leg portion 25b via an adhesive material 61. The second lens 31E is connected to the housing lower face 51a via an adhesive material 61 so as to have a predetermined amount of space from the first lens 11. The first lens 11 and the second lens 31E are preferably disposed such that their optical axes are aligned with the center of the transparent member 54.

In the case of a light source device 100E, because the first lens 11 is attached to the substrate 41 while the second lens 31E is attached to the housing 51, the first lens 11 and the second lens 31E can easily be replaced independently. Attaching the second lens 31E to the housing 51 can improve the external appearance quality of the light source device 100E.

Seventh Embodiment

Figure 12:
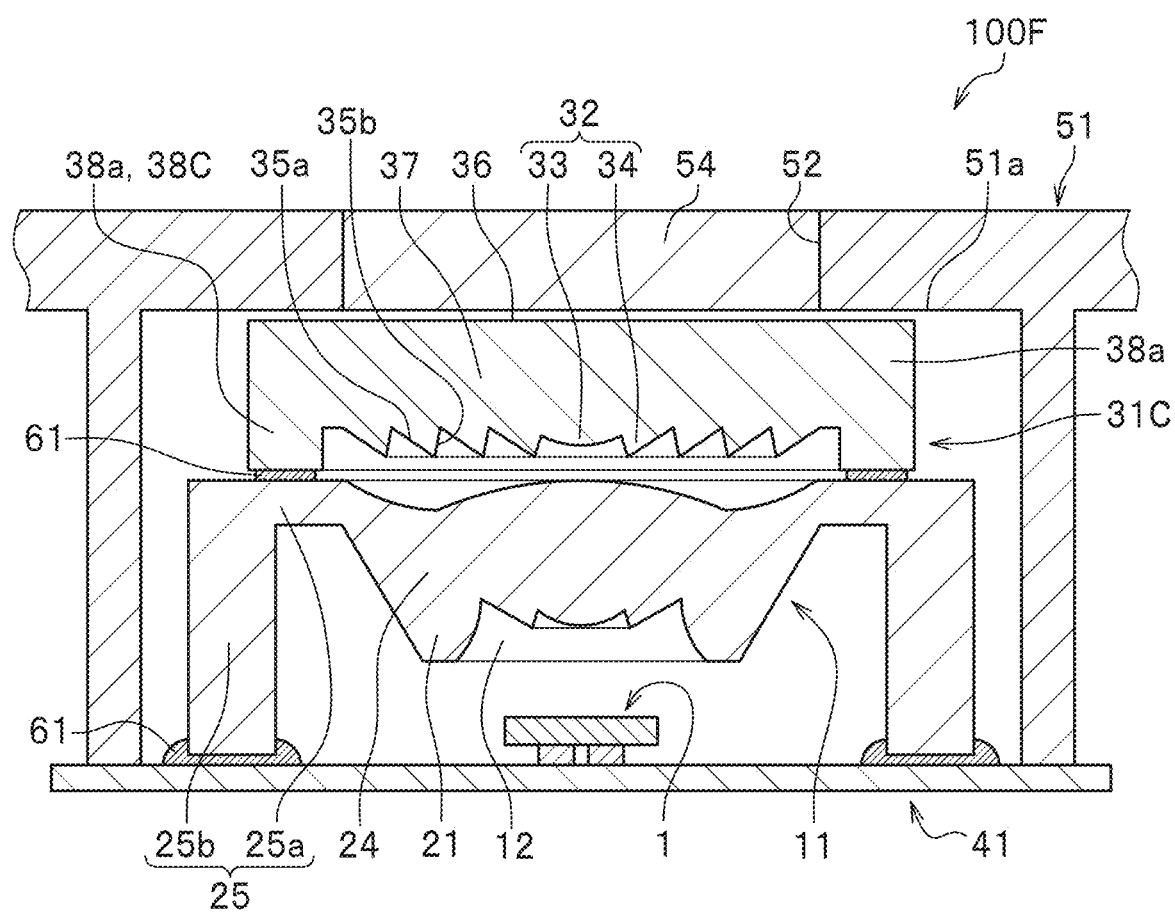
FIG. 12 is a cross-sectional view schematically showing the structure of a light source device according to a seventh embodiment.

FIG. 12 is a cross-sectional view schematically showing the structure of a light source device 100F according to a seventh embodiment.

The light source device 100F according to the seventh embodiment includes features identical to those of the light source device 100C according to the fourth embodiment except that the second lens 31C, which is fixed to the first lens 11 that is fixed to the substrate 41, is not fixed to the housing 51.

Because the second lens 31C, which is fixed to the first lens 11, is not fixed to the housing 51 in the light source device 100F, the first lens 11 and the second lens 31C can be simultaneously replaced. Moreover, in the case of a light source device 100F, the second lens 31C can be fixed to the first lens 11 after fixing the first lens 11 to the substrate 41. In other words, the second lens 31C can be disposed after positioning the first lens 11 in conformance with the position of a light emitting device 1. This can reduce the degradation of optical characteristics and external appearance quality attributable to misalignment between the optical axis of a light emitting device 1 and the center of the lenses.

The light source devices 100A to 100F described above each have two lenses: a first lens disposed to face a light emitting device, and a second lens disposed to face the first lens. By using the first lens 11 and the second lens 31 one over the other in this manner, light can be collected by using two faces, for example, the entrance face and the exit face of the first lens. This allows for a more complex optical design.

Furthermore, making the upper face of the second lens as a flat face to be exposed when the second lens is inserted into the opening of the housing can provide a light source that is integrated with the housing.

Using the first lens 11 and the second lens 31 in combination in this manner allows for a flexible design accommodating a light source and housing.

Eighth Embodiment

Figure 13:
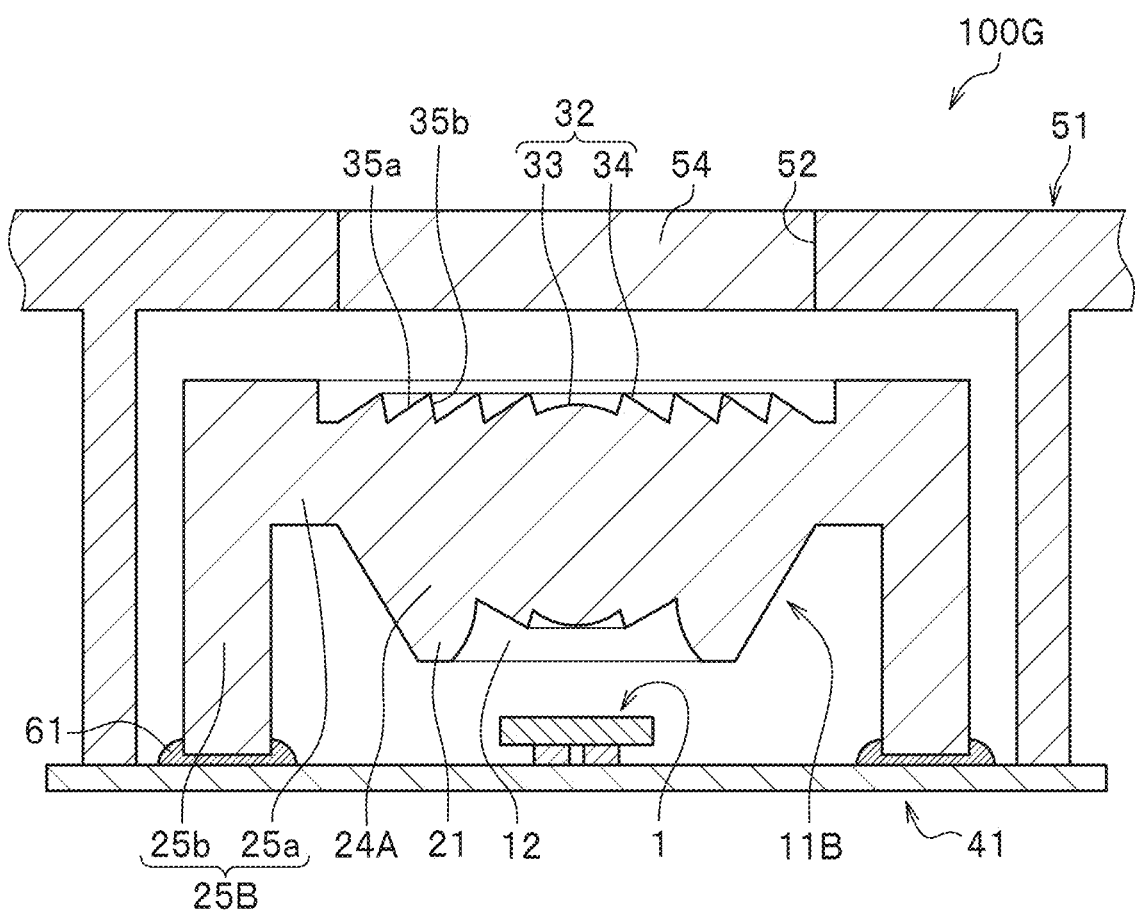
FIG. 13 is a cross-sectional view schematically showing the structure of a light source device according to an eighth embodiment.

FIG. 13 is a cross-sectional view schematically showing the structure of a light source device 100G according to an eighth embodiment.

The light source device 100G according to the eighth embodiment includes features identical to those of the light source device 100F according to the seventh embodiment except that no second lens 31C is provided, and the upper face of the first lens 11B fixed to the substrate 41 constitutes a Fresnel lens face 32. The Fresnel lens face 32 in the light source device 100G includes a central convex portion 33 protruding towards the housing 51 that is positioned at the light emission face side, and a plurality of annular protruding portions 34 concentrically arranged around the central convex portion 33 and protruding towards the housing 51. Furthermore, in the light source device 100G, because the first lens 11B includes a Fresnel lens face 32, the thicknesses of the first main body 24A and the first marginal part 25B (the first upper portion 25a) are larger as compared to the thicknesses of the first main body 24 and the first marginal part 25 (the first upper portion 25a) of the first lens 11 of the light source device 100F.

The first lens 11B in the light source device 100G has a lower face constituting an entrance part 12 and a light guide part 21, and an upper face constituting a Fresnel lens face 32. Accordingly, the light source device 100G can not only reduce light loss by allowing the lower face of the first lens 11B to capture the light from the light emitting device 1 without loss of light, but also improve the light emission efficiency and the light distribution control towards a wider angle while keeping the size of the opening 52 of the housing 51 small. Furthermore, in the case of a light source device 100G, degradation of the optical characteristics and the external appearance quality attributable to misalignment of the optical axis of the light emitting device 1 and the center of the first lens 11B can be reduced.

Ninth Embodiment

Figure 14:
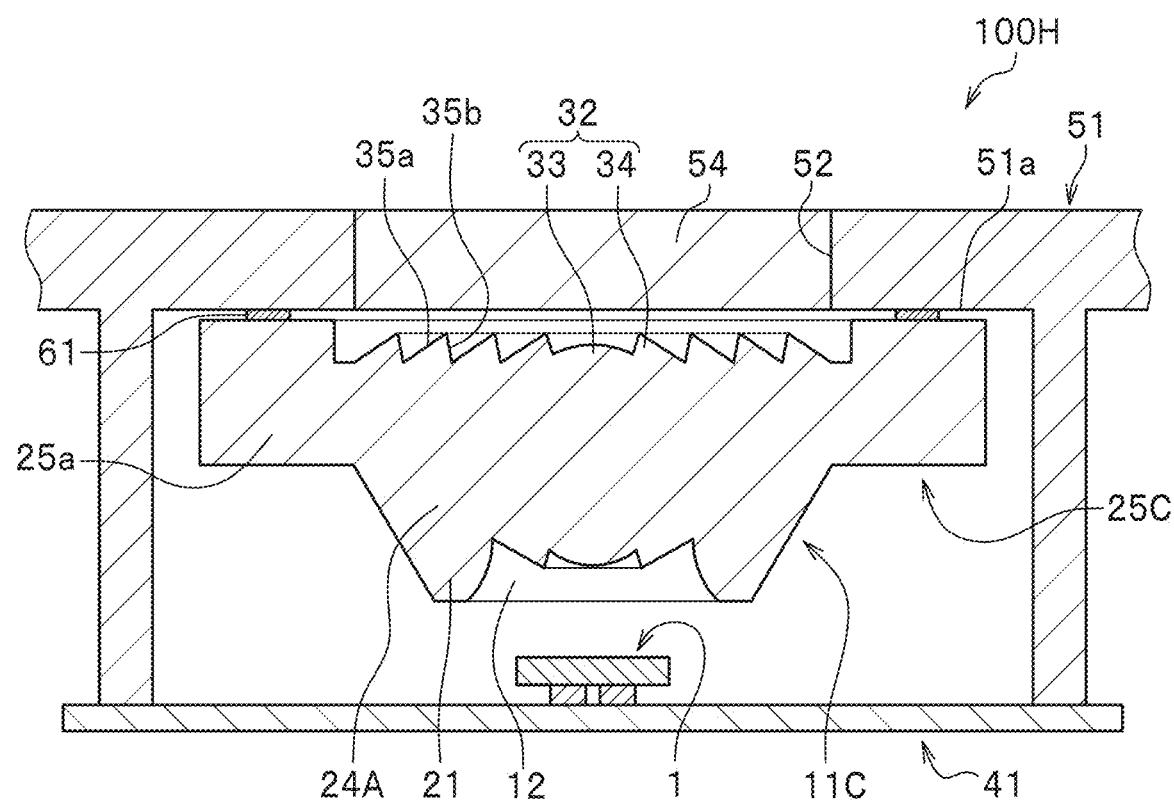
FIG. 14 is a cross-sectional view schematically showing the structure of a light source device according to a ninth embodiment.

FIG. 14 is a cross-sectional view schematically showing the structure of a light source device 100H according to a ninth embodiment.

The light source device 100H according to the ninth embodiment includes features identical to those of the light source device 100D according to the fifth embodiment except that no second lens 31C is provided, and the upper face of the first lens 11C fixed to the housing 51 includes a Fresnel lens face 32. The Fresnel lens face 32 in the light source device 100H includes a central convex portion 33 protruding towards the housing 51 that is positioned at the light emission face side, and a plurality of annular protruding portions 34 concentrically arranged along the shape of the central convex portion 33 and protruding towards the housing 51. Furthermore, in the light source device 100H, because the first lens 11C includes a Fresnel lens face 32, the thicknesses of the first main body 24A and the first marginal part 25C (the first upper portion 25a) are larger as compared to the thicknesses of the first main body 24 and the first marginal part 25A (the first upper portion 25a) of the first lens 11A of the light source device 100D.

In the case of a light source device 100H, the position of the first lens 11C can be easily adjusted in conformance with the opening 52. This can reduce misalignment with the opening 52 to thereby reduce the degradation of the external appearance quality.

Each of the light source devices 100G and 100H according to the embodiments described above includes, as an optical lens, a first lens disposed to face the light emitting device. The lower face of the first lens collects the light from the light emitting device, and the collected light is refracted by the Fresnel lens face at the upper face of the first lens to exit in a predetermined irradiation range. In such a light source device, the optical design is simplified as compared to one employing two lenses, and can further facilitate size reduction in the light source device.

In the Fresnel lens face 32 in each of the embodiments described above, as shown in FIG. 19A to 19D, the inclination angles of the Fresnel faces 35a positioned on the same circumferences may differ in the circumferential direction. In other words, in the Fresnel lens face 32 that includes a central convex portion 33 provided in the center and annular protruding portions 34 each composed of a Fresnel face 35a and a rise face 35b that are concentrically formed along the shape of the central convex portion 33, the inclination angle of a Fresnel face 35a relative to the optical axis may change in the circumferential direction in a plan view. This allows the light distribution to be adjusted to have any shape.

For example, adjusting the inclination angles of the Fresnel faces 35a to spread the irradiation range more in the vertical direction than the lateral direction, and more in the diagonal directions than the vertical direction, so as to be contained in a vertical rectangular angle of view of a camera allows the device to efficiently irradiate within the camera's angle of view. Specifically, in the Fresnel lens face 32, the inclination angles θ of the Fresnel faces 35a, relative to the optical axis OP, located in the radial directions corresponding to the directions in which the irradiation range AE is to spread more are set smaller than the inclination angles θ of the Fresnel faces 35a, relative to the optical axis OP, at other locations. Alternatively, in the Fresnel lens face 32, the inclination angles θ of the Fresnel faces 35a, relative to the optical axis OP, located in the radial directions corresponding to the directions in which the spreading of the irradiation range AE is to be reduced are set larger than the inclination angles θ of the Fresnel faces 35a, relative to the optical axis OP, at other locations.

Figure 19B:
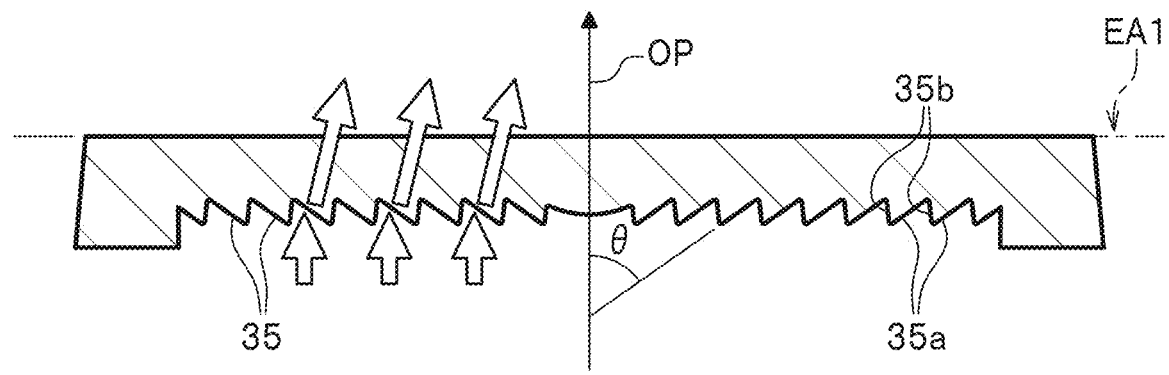
FIG. 19B is a cross-sectional view taken along a straight line at 0 degrees in FIG. 19A.
Figure 19C:
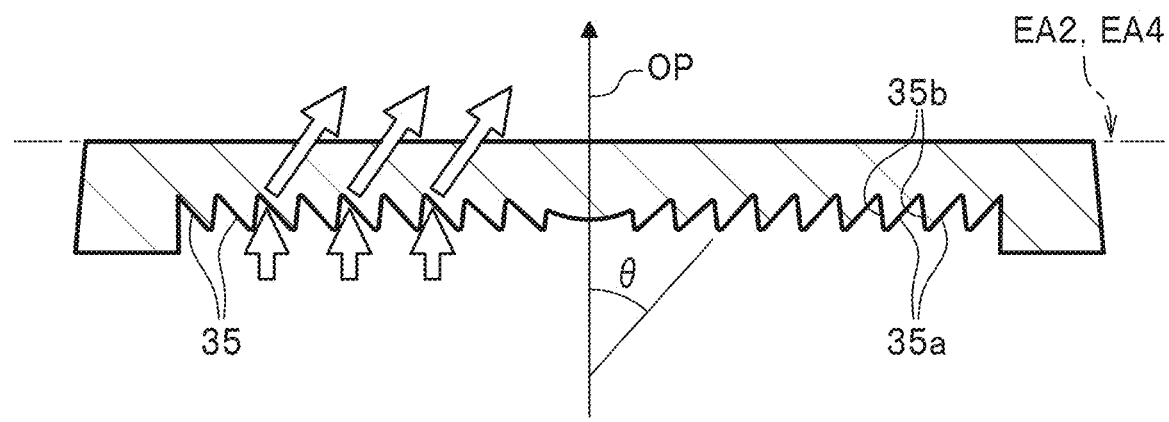
FIG. 19C is a cross-sectional view taken along a straight line at 45 degrees in FIG. 19A.
Figure 19D:
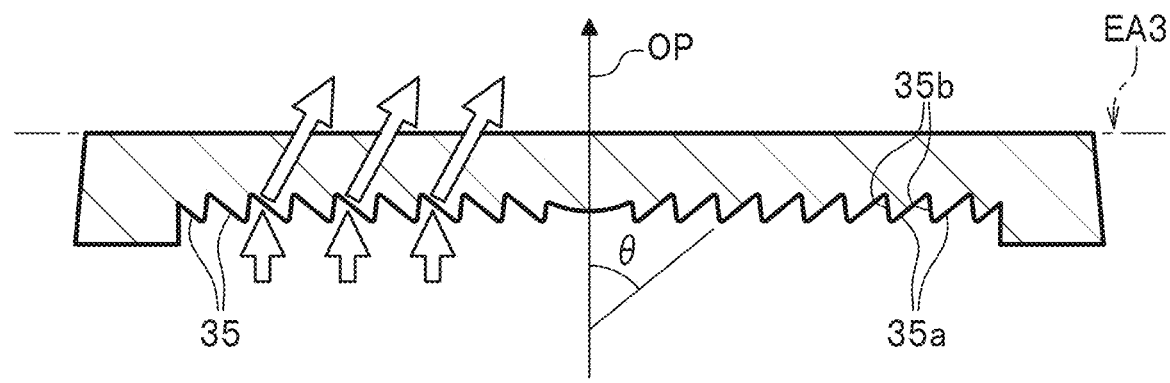
FIG. 19D is a cross-sectional view taken along a straight line at 90 degrees in FIG. 19A.
Figure 19E:
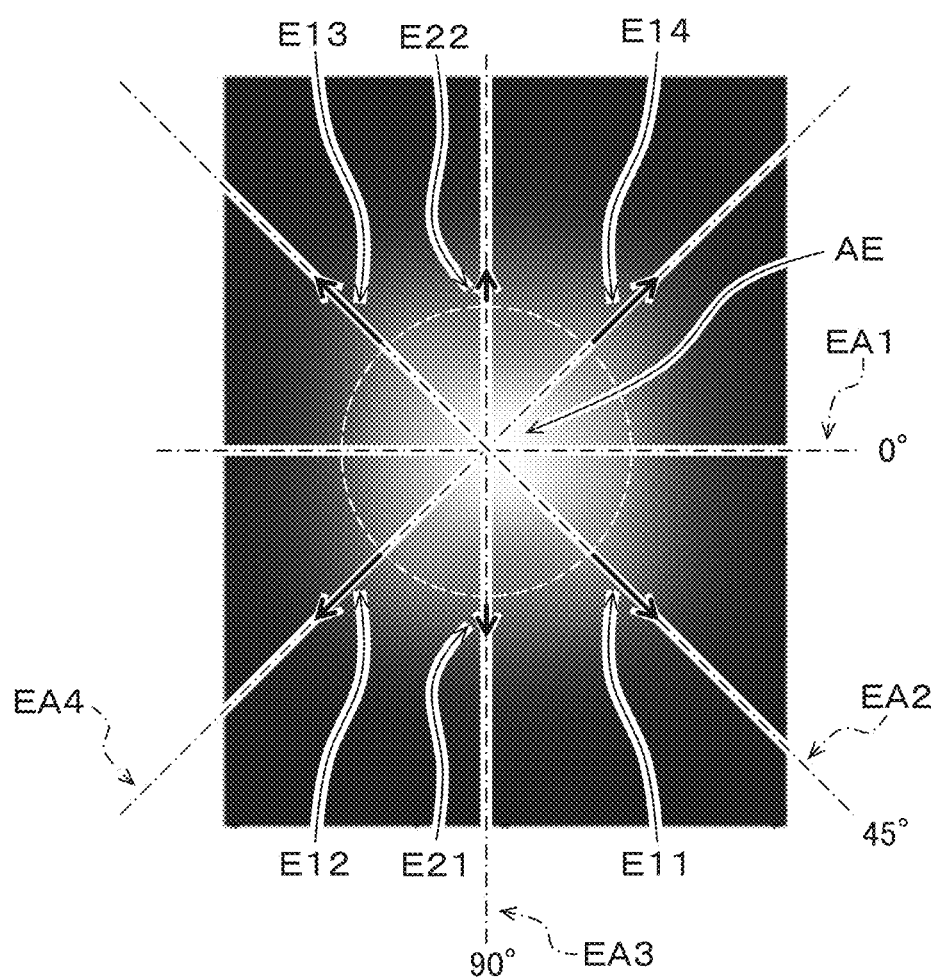
FIG. 19E is a schematic diagram showing the illuminance distribution of the light source device using the Fresnel lens face in the variation.

In other words, the Fresnel lens face 32, as shown in FIG. 19A and FIG. 19E, is formed such that the inclination angles of the Fresnel faces relative to the optical axis OP become smaller in the order, from large to small, for those in the radial direction EA3 controlling the irradiation range in the up/down direction, and the radial directions EA2 and EA4 controlling the irradiation range in the diagonal directions between the left/right direction and the up/down direction by using, for example, the radial direction EA1 controlling the irradiation range in the left/right direction as a reference. Here, the inclination angles θ of the Fresnel faces 35 relative to the optical axis OP in the EA1 cross section, the EA3 cross section, and the EA2/EA4 cross section, are set as 55°, 51°, and 42°, respectively. In each of the radial directions EA1, EA2, EA3, and EA4, the inclination angles θ of the Fresnel faces 35 relative to the optical axis OP gradually change along the circumferential direction. Accordingly, no clear boundaries of the Fresnel faces 35 are visually recognizable in the circumferential direction. The arrows E11, E12, E13, E14, E21, and E22 in FIG. 19E indicate degree of the relative irradiation range expansions using the lengths of the arrows. Here, the diagram shows that expansions of the irradiation range in the directions E11, E12, E13, and E14 are larger than those in the directions E21 and E22.

The optical simulations performed using models of light source devices in Examples and Comparative Examples will be explained below. Light source devices are not limited to those described below.

Figure 15A:
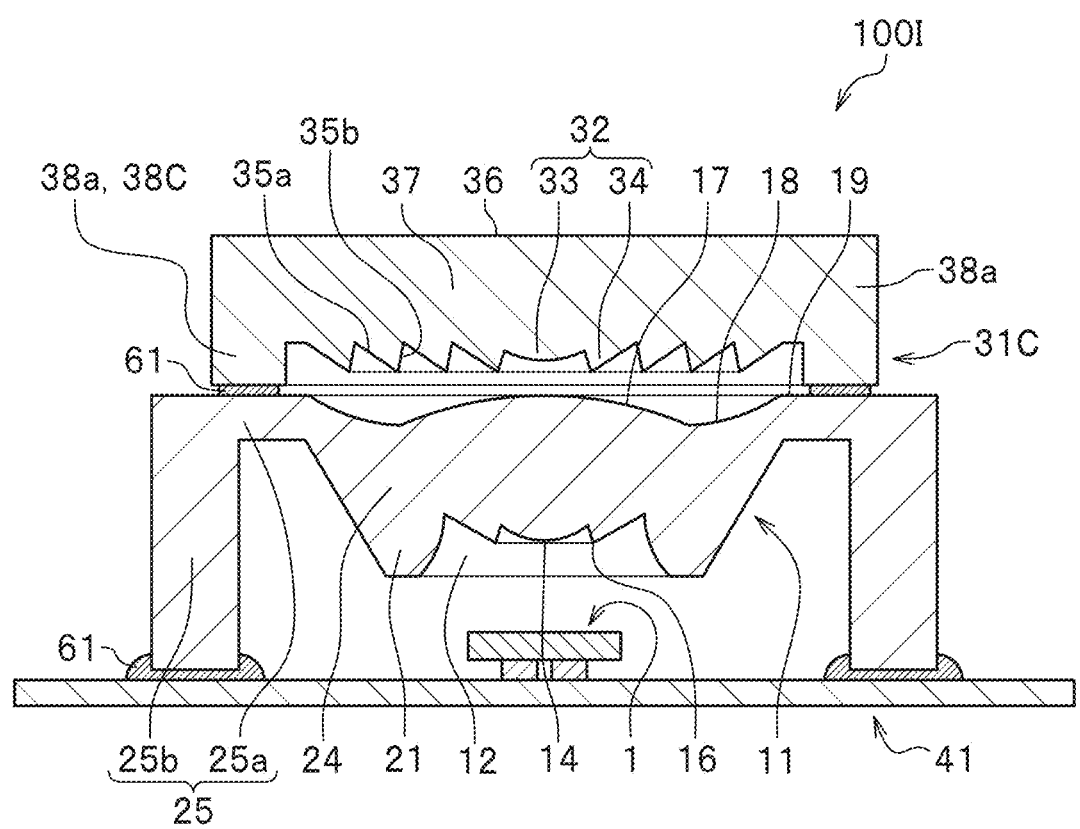
FIG. 15A is a cross-sectional view showing the structure of a light source device in Example 1.
Figure 15B:
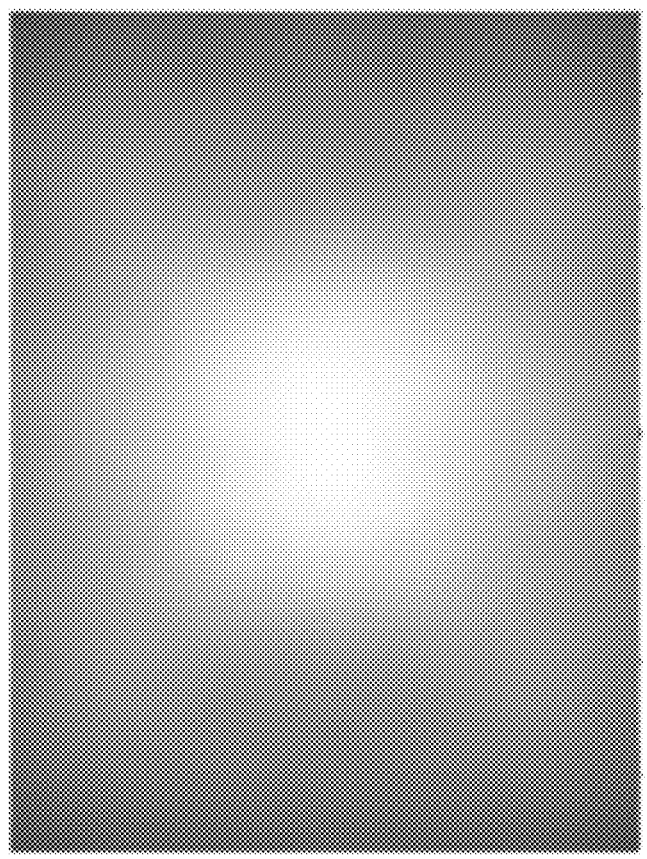
FIG. 15B is a schematic diagram showing the illuminance distribution of the light source device in Example 1.
Figure 16A:
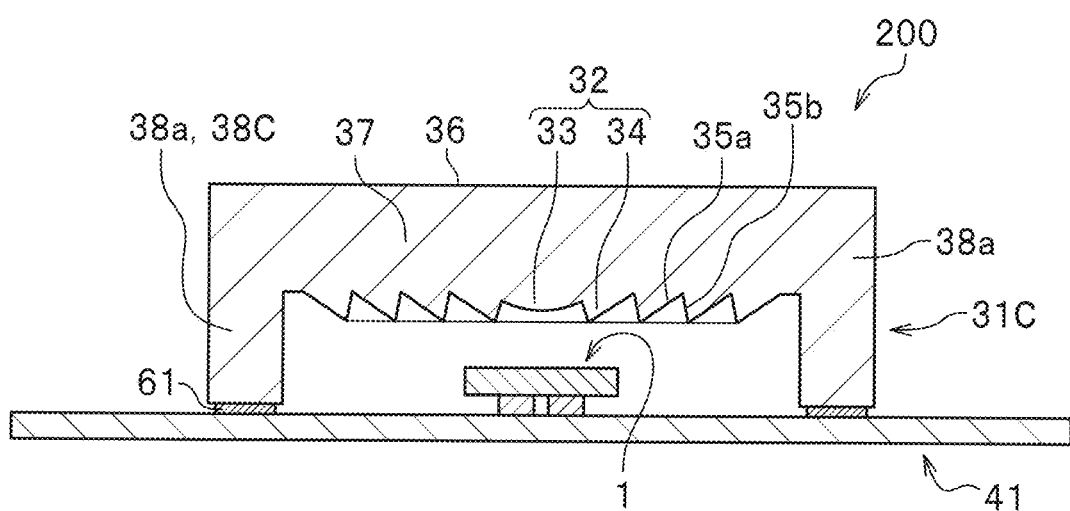
FIG. 16A is a cross-sectional view showing the structure of a light source device in Comparative Example 1.

FIG. 15A is a cross-sectional view showing the structure of the light source device in Example 1. FIG. 16A is a cross-sectional view of the light source device in Comparative Example 1.

Example 1

A virtual model of the light source device 100I shown in FIG. 15A was prepared as Example 1. The light source device 100I included features identical to those of the light source device 100F according to the seventh embodiment except for not having a housing 51.

In the light source device 100I, as shown in FIG. 5 and FIG. 15A, the first lens 11 included, in the lower face, an entrance part 12 that included a circular lower face convex portion 14 having a 0.66 mm outer diameter in a plan view in the lower face center and a 0.4 mm wide annular angular portion 16 contiguous with the periphery of the lower face convex portion 14, and a 1 mm wide annular light guide part 21 contiguous with the periphery of the angular portion 16. The first lens 11 included, in the upper face, a circular upper face convex portion 17 having a 2.1 mm outer diameter in a plan view in the upper face center, an upper face concave portion 18 contiguous with the upper face convex portion 17, and a 0.66 mm wide annular flat portion 19 provided around the upper face convex portion 17 via the upper face concave portion 18.

In the light source device 100I, as shown in FIG. 15A, and FIG. 6, which is a plan view of a second lens 31 corresponding to the second lens 31C, the second lens 31C included a Fresnel lens face 32 in the lower face. The second lens 31C included a central convex portion 33 having a 0.18 mm radius circular shape in a plan view in the center of the Fresnel lens face 32, a protruding portion 34 concentrically formed and having a peak at the 1.6 mm radius that is the furthest position from the center of the Fresnel lens face, and a plurality of protruding portions 34 concentrically provided at equal intervals between the furthest protruding portion 34 and the central convex portion 33. The second lens 31C included, in the upper face, a flat face 36 having a 2.1 mm radius circular shape in a plan view. The light source device 100I was provided with four protruding portions 34.

Using the virtual model of the light source device 100I, the illuminance distribution and the central illuminance were measured, and the emission efficiency obtained, by simulation under the measuring conditions listed below. The central illuminance measured was 684 lx, and the emission efficiency was 43%.

Measuring Conditions
Size of the evaluation photoreceiver: 280×370 mm
Distance between the light emitting devices and the evaluation photoreceiver: 300 mm
Angle of view of the evaluation photoreceiver: 75 degrees
Light emitting device's light emission face size: 0.8×0.8 mm
Distance between the light emitting device top surfaces and the first lens: 0.1 mm
Light emitting devices' luminous flux: 190 lm
Emission efficiency: (amount of light received by the photoreceiver having a 75 degree angle of view)/(light emitting device's luminous flux)

Comparative Example 1

As Comparative Example 1, a virtual model of the light source device 200 shown in FIG. 16A was prepared. The light source device 200 had no first lens 11. For comparison purposes, the lens shape of the Fresnel lens face 32 of the second lens 31C was optimized to have substantially the same illuminance as that of the light source device 100I in Example 1. In the light source device 200, the length of the second leg portion 38a of the second marginal part 38C was adjusted to be longer so as not to allow the Fresnel lens face 32 of the second lens 31C to come into contact with the light emitting device 1.

Figure 16B:
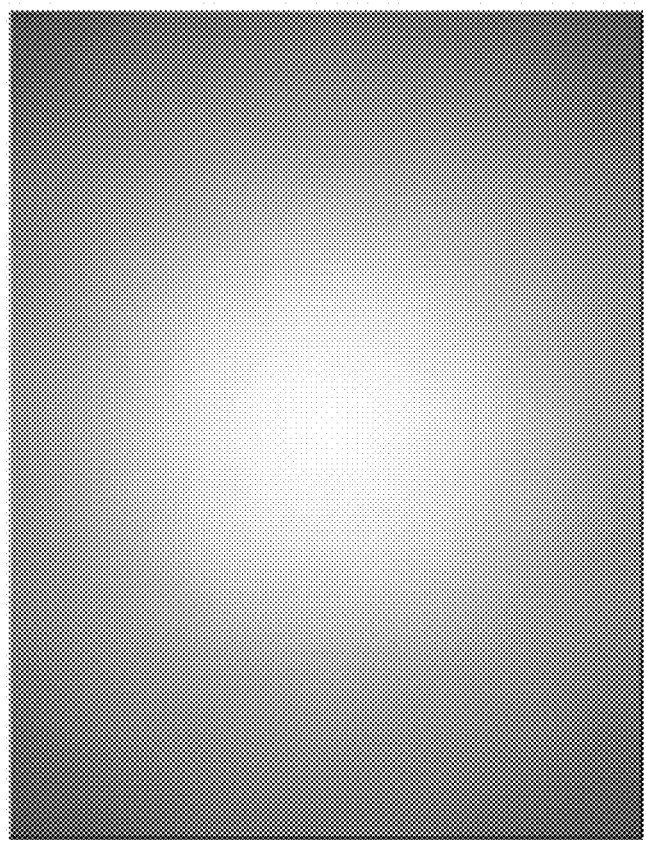
FIG. 16B is a schematic diagram showing the illuminance distribution of the light source device in Comparative Example 1.

Using the virtual model of the light source device 200, the illuminance distribution and the central illuminance were measured, and the emission efficiency was obtained, by simulation, in a similar manner to in Example 1. FIG. 16B is a schematic diagram showing the illuminance distribution. The central illuminance measured was 574 lx, and the emission efficiency was 38%.

The light source device 100I in Example 1 demonstrated a 19% increase in the central illuminance, and a 5% increase in the emission efficiency, as compared to the light source device 200 in Comparative Example 1. In the case of Example 1, the portion of the exiting light from the first lens 11 that would otherwise exit outside of a desired irradiation range can be refracted by the Fresnel lens face 32 of the second lens 31C to exit in the desired irradiation range to thereby improve the central illuminance and the emission efficiency.

Figure 17A:
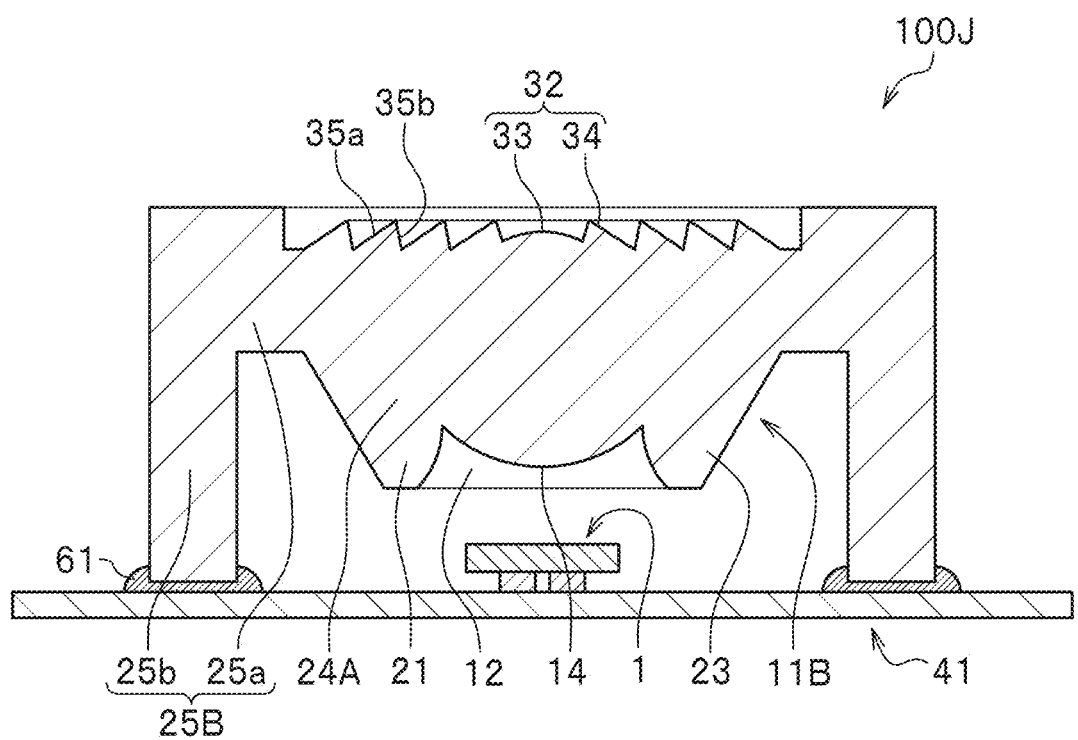
FIG. 17A is a cross-sectional view showing the structure of a light source device in Example 2.
Figure 18A:
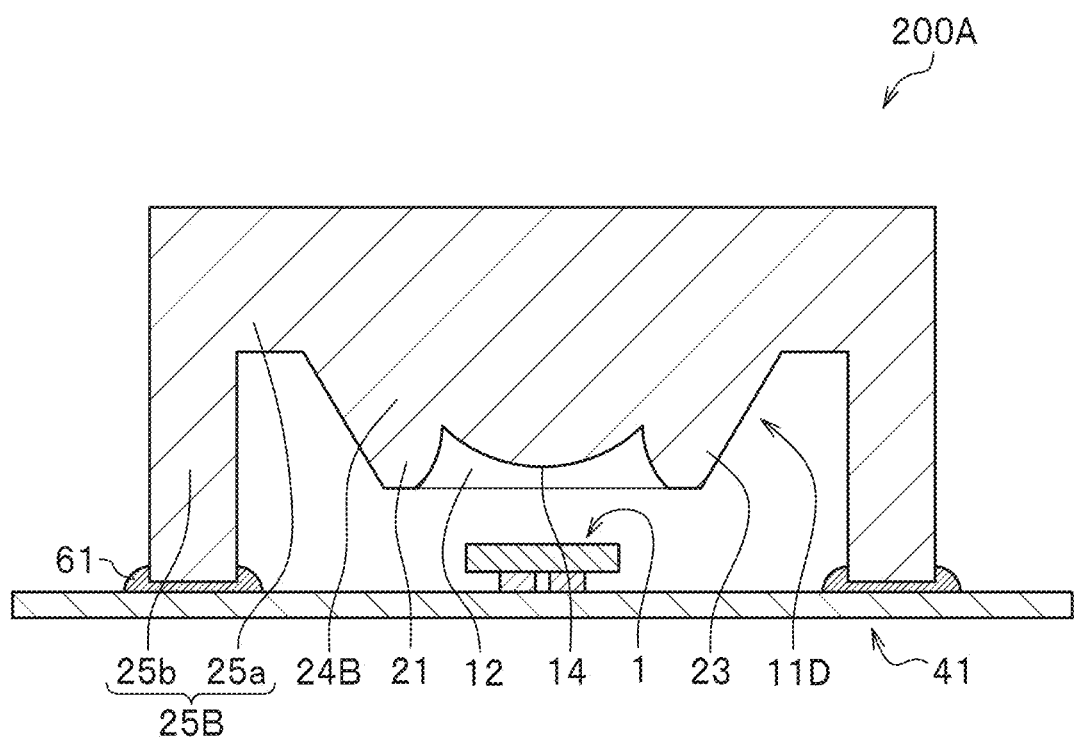
FIG. 18A is a cross-sectional view showing the structure of a light source device in Comparative Example 2.

FIG. 17A is a cross-sectional view showing the structure of the light source device in Example 2. FIG. 18A is a cross-sectional view showing the structure of the light source device in Comparative Example 2.

Example 2

As Example 2, a virtual model of the light source device 100J shown in FIG. 17A was prepared. The light source device 100J included features identical to those of the light source device 100I in Example 1 except that no second lens 31C was provided and the upper face of the first lens 11B was provided with a Fresnel lens face 32 similar to that of the second lens 31C. In the light source device 100J, the entrance part 12 provided in the lower face of the first lens 11B was composed only of the lower face convex portion 14.

Figure 17B:
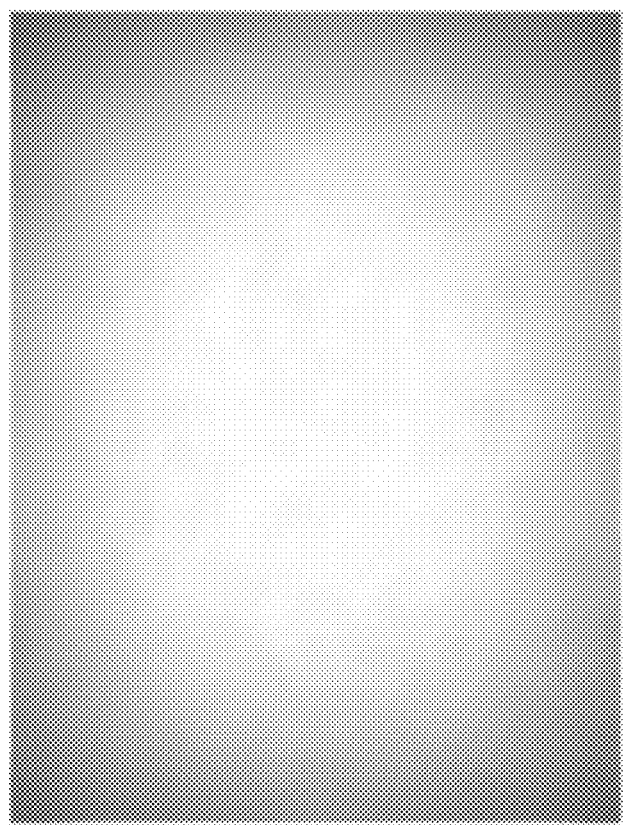
FIG. 17B is a schematic diagram showing the illuminance distribution of the light source device in Example 2.

Using the virtual model of the light source device 100J, the illuminance distribution and the central illuminance were measured, and the emission efficiency was obtained, by simulation, in a similar manner to in Example 1. FIG. 17B is a schematic diagram showing the illuminance distribution. The central illuminance measured was 1026 lx, and the emission efficiency was 46%. In the measuring conditions for the simulation, the size of the evaluation photoreceiver was 280×370 mm, and the angle of view of the evaluation photoreceiver was 75 degrees.

Comparative Example 2

As Comparative Example 2, a virtual model of the light source device 200A shown in FIG. 18A was prepared. The light source device 200A included features identical to those of the light source device 100J in Example 2 except that the upper face of the first lens 11D was a flat face.

Figure 18B:
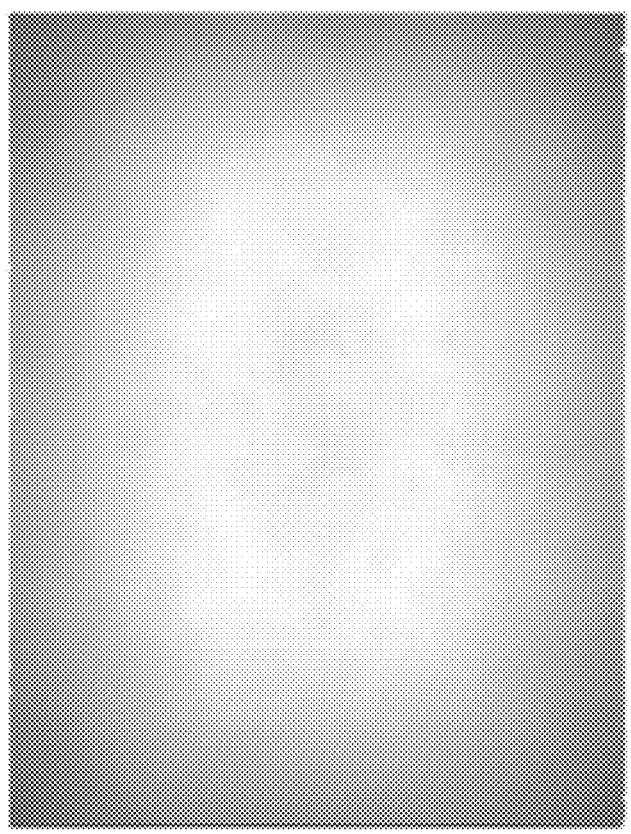
FIG. 18B is a schematic diagram showing the illuminance distribution of the light source device in Comparative Example 2.

Using the virtual model of the light source device 200A, the illuminance distribution and the central illuminance were measured, and the emission efficiency obtained, by simulation, in a similar manner to in Example 2. FIG. 18B is a schematic diagram showing the illuminance distribution. The central illuminance measured was 946 lx, and the emission efficiency was 44%.

The light source device 100J in Example 2 demonstrated an 8% increase in the central illuminance, and a 2% increase in the emission efficiency, as compared to the light source device 200A in Comparative Example 2. In the case of Example 2, the portion of the light collected by the entrance part 12 that would otherwise exit outside of a desired irradiation range can be refracted by the Fresnel lens face 32 to exit in the desired irradiation range to thereby improve the central illuminance and the emission efficiency Various changes may be applied to each constituent described in the forgoing. For example, the number of the angular portions 16 of the Fresnel lens face in the first lens may be increased, or the curvature of the Fresnel lens face may be suitably changed. Furthermore, in each of the embodiments described above, the flat face of the second lens has been described as coplanar with the surface of the housing, but a protective sheet may be applied to the flat face to make the surface of the protective sheet coplanar with the surface of the housing.

DESCRIPTION OF REFERENCE NUMERALS

1 Light emitting device
2 Light emitting element
3 Electrode
4 Light transmissive member
5 Cover member
11, 11A, 11B, 11C, 11D First lens
12 Entrance part
14 Lower face convex portion
16 Angular portion
17 Upper face convex portion
18 Upper face concave portion
19 Flat portion
21 Light guide part
22 Inner lateral face
23 Oblique face
24, 24A First main body
25, 25A, 25B, 25C, First marginal part
25a First upper portion
25b First leg portion
31, 31C, 31E Second lens
32 Fresnel lens face
33 Central convex portion
34 Protruding portion
35 Entering the lens
36 Flat face
37 Second main body
38, 38C, 38E Second marginal part
38a Second leg portion
38b Second attaching portion
41 Substrate
42 Wiring
51 Housing
51a Housing loser face
52 Opening
53 Leg portion
54 Transparent member
61 Adhesive material
62 Conductive adhesive material
100, 100A, 100B, 100C, 100D, 100E, 100F, 100G, 100I, 100J, 200, 200A Light emitting device

What is claimed is:

1. A light source device comprising:
a substrate;
a light emitting device mounted on the substrate and having an upper face comprising a light emission face;
a housing defining a space; and
a lens located in the space of the housing, fixed to the housing, and having a lower face that faces the light emitting device, and an upper face opposite the lower face, the lens comprising:
a first main body, and
a first marginal part extending laterally from a periphery of the first main body; wherein:
the first main body of the lens comprises:
an entrance part located in a center of the lower face of the lens where light from the light emitting device enters,
a light guide part located in a portion of the lower face of the lens at a location outward of the entrance part and configured to guide the light entering the entrance part, and
a plurality of annular protruding portions located in the upper face of the lens, wherein the plurality of annular protruding portions comprise:
a plurality of entrance faces where light from the lens enters, and
a plurality of rise faces, each located between adjacent ones of the plurality of entrance faces; and
the plurality of entrance faces have inclination angles relative to an optical axis of the lens that change in a circumferential direction.

2. The light source device according to claim 1, wherein:
the entrance part comprises a concave portion formed in the lower face of the first main body.

3. The light source device according to claim 2, wherein:
the lower face of the first main body comprises, in a bottom face of the concave portion, a lower face convex portion protruding towards the light emitting device.

4. A cellular phone comprising:
a cellular phone housing; and
the light source device according to claim 1; wherein:
the housing of the light source device is a portion of the cellular phone housing.

5. A light source device comprising:
a light emitting device having an upper face comprising a light emission face; and a lens having a lower face that faces the light emitting device, and an upper face opposite the lower face; wherein:

the lower face of the lens comprises:
- an entrance part located in a center of the lower face where light from the light emitting device enters, and
- a light guide part located outward of the entrance part and configured to guide the light entering the entrance part;

the upper face of the lens comprises a plurality of annular protruding portions, which comprise:
- a plurality of entrance faces where light from the lens enters, and
- a plurality of rise faces, each located between adjacent ones of the plurality of entrance faces; and the plurality of entrance faces have inclination angles relative to an optical axis of the lens that change in a circumferential direction.

6. The light source device according to claim 5, further comprising:
a substrate on which the light emitting device is mounted; and
a housing defining a space in which the lens is located; wherein:
the lens is fixed to the substrate.

7. The light source device according to claim 6, wherein: the lens comprises:
a first main body comprising the entrance part, the light guide part, and the plurality of annular protruding portions, and
a first marginal part extending laterally from a periphery of the first main body.

8. A cellular phone comprising:
a cellular phone housing; and
the light source device according to claim 6; wherein:
the housing of the light source device is a portion of the cellular phone housing.

9. The light source device according to claim 5, further comprising:
a substrate on which the light emitting device is mounted; and
a housing defining a space in which the lens is located; wherein:
the lens is fixed to the housing.

10. A cellular phone comprising:
a cellular phone housing; and
the light source device according to claim 9; wherein:
the housing of the light source device is a portion of the cellular phone housing.

11. The light source device according to claim 5, wherein: the lens comprises:
a first main body comprising the entrance part, the light guide part, and the plurality of annular protruding portions, and
the entrance part comprises a concave portion formed in the lower face of the first main body.

12. The light source device according to claim 11, wherein the lower face of the first main body comprises, in a bottom face of the concave portion, a lower face convex portion protruding towards the light emitting device.

* * * * *